(12) United States Patent
Ogirko et al.

(10) Patent No.: US 8,614,587 B1
(45) Date of Patent: Dec. 24, 2013

(54) CAPACITANCE SENSING CIRCUITS AND METHODS

(71) Applicant: Cypress Semiconductor Corporation, San Jose, CA (US)

(72) Inventors: Roman Ogirko, Lviv (UA); Andriy Maharyta, Lviv (UA); Viktor Kremin, Lviv (UA)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 13/929,350

(22) Filed: Jun. 27, 2013

Related U.S. Application Data

(60) Provisional application No. 61/777,314, filed on Mar. 12, 2013.

(51) Int. Cl.
*G01R 27/26* (2006.01)

(52) U.S. Cl.
USPC .......................................... 324/678; 324/686

(58) Field of Classification Search
USPC .................................................. 324/678, 686
See application file for complete search history.

(56) References Cited

U.S. PATENT DOCUMENTS

| | | | |
|---|---|---|---|
| 6,750,796 B1 | 6/2004 | Holloway et al. | |
| 7,091,727 B2 * | 8/2006 | Lee | 324/681 |
| 7,400,280 B2 | 7/2008 | Kushner et al. | |
| 7,683,641 B2 * | 3/2010 | Hargreaves et al. | 324/686 |
| 2008/0036473 A1 | 2/2008 | Jansson | |
| 2009/0079607 A1 | 3/2009 | Denison et al. | |
| 2012/0217982 A1 | 8/2012 | Narayanasamy et al. | |
| 2012/0235784 A1 | 9/2012 | Teterwak et al. | |
| 2012/0274404 A1 | 11/2012 | Erdogan et al. | |

FOREIGN PATENT DOCUMENTS

| | | |
|---|---|---|
| EP | 0404980 B1 | 1/1991 |
| WO | 2010111668 A1 | 9/2010 |

OTHER PUBLICATIONS

International Search Report for International Application No. PCT/US13/50727 dated Sep. 18, 2013; 3 pages.
Written Opinion of the International Searching Authority for International Application No. PCT/US13/50727 mailed Sep. 18, 2013; 3 pages.

* cited by examiner

*Primary Examiner* — Amy He

(57) ABSTRACT

A capacitance sense system can include a capacitance sense input configured to receive an input signal that varies according to a sensed capacitance; an integrator/discharge circuit configured to integrate the input signal and discharge the integrated input signal toward the reference level in conversion operations; and a remainder retainer section configured to quantize the discharging of the integrated input signal, and retain any remainder of the integrated input signal that follows a quantization point for a next conversion by the integrator/discharge circuit.

20 Claims, 12 Drawing Sheets

CAPACITANCE SENSING CIRCUITS AND METHODS

This application claims the benefit of U.S. provisional patent application Ser. No. 61/777,314 filed on Mar. 12, 2013, the contents of which are incorporated by reference herein.

TECHNICAL FIELD

The present disclosure relates generally to capacitance sensing systems, and more particularly to capacitance touch sensing systems and methods.

BACKGROUND

Capacitance sensing systems can utilize a mutual capacitance between transmit electrodes and receive electrodes to detect the proximity of an object (e.g., a finger). By application of an excitation signal, a charge (current) can be generated on a receive electrode that varies according to the mutual capacitance between the electrodes. Such a mutual capacitance can vary according to the proximity of an object. Such systems can be conceptualized as being "charge transfer" systems.

Some conventional touch screen sensing systems can utilize charge transferring methods. In these conventional systems, charge generated by a periodic excitation signal can be collected by an active integrator circuit over several excitation cycles. Such charge collection can be combined with demodulation to obtain a synchronous rectification of an incoming signal. Such conventional approaches can include a baseline compensation to prevent the integrator circuit from becoming saturated by non-informative capacitance. (Non-informative capacitance does not vary according to an object, i.e., touch)). Usually, non-informative capacitance can be 90% of the sensed capacitance (i.e., variation caused by a touch is usually 10% of the sensor capacitance).

Achieving a desired sensitivity in a charge transfer system can require that multiple sensing cycles (i.e., transitions of the excitation signal) be collected by the active integrator. Unfortunately, the noise immunity of such systems typically decreases in proportion to the number of sensing cycles. Consequently, the dynamic range of such conventional systems could be limited. Further, noise spikes in such conventional systems can result in integrators being driven into saturation, losing any measurement information.

One conventional approach to addressing the limitations of the above conventional charge transfer systems can be to deliver the results of a conversion after every excitation edge (i.e., transition of the excitation signal). Demodulation, integration, and analog to digital conversion can enable the generation of a digital value representing the capacitance. Satisfactory resolution in such conventional systems can rely on accumulation of the digital values having noise close to one least significant bit (LSB). Conventional approaches can utilize advanced filtration techniques during integration phase to minimize the external noise impact at the end of conversion.

A drawback to the above-noted conventional system can be that increases in the resolution of the sensing channel are proportional to the square-root of the accumulated conversions numbers. Thus, such a conventional system can require a relatively high-resolution analog-to-digital converter (ADC) that operates at a relatively low frequency and with a limited integration time. For example, integration of the convertor samples during 100 us, when the excitation signal frequency is 100 kHz, can correspond to an ADC resolution increasing by sqrt(20)=4.5 times (2 bits). Further, the digital accumulation of conversion results can require an ADC with very small differential nonlinearity (DNL) because the DNL is systematic for all the conversions result, and is not reduced by averaging values.

A second conventional approach to addressing the limitations of basic charge transfer systems can be to employ a "charge balancing" method. In a charge balancing method, an integrated input signal initially charges an integrating capacitor. The capacitance is then discharged by a reference current. Once the capacitor is returned to its initial state (i.e., it is balanced) the reference current is terminated. A charge balancing system is thus understood to be similar to a relaxation circuit. In some charge balancing systems, integration and charge balancing can occur at the same time. The time it takes to achieve such charge balancing can be converted to a digital value. For example, the number of reference clock pulses that occur over the charge balancing operation can be count value. This count value will vary according to the sensed capacitance. Charge balancing systems can have very good linearity as compared to basic charge transfer systems.

A drawback to a conventional charge balancing systems can be the sensitivity of a sense circuit (channel) to the incomplete recharging of the integrating capacitor, the possibility of the channel being synchronized by external noise, as well as the channel being susceptible to such noise.

FIG. 13 shows a conventional charge transfer system 1300 in a functional schematic diagram. Conventional system 1300 can include an excitation source Vex 1301 that drives a sensor network 1303 with a buffer 1305. In response to the excitation signal from source 1301, a sensor of sensor network 1303 can form an output current Im. Current Im corresponds to charge transferred through the sensor during a half-period of the excitation signal, and can represent a sensed capacitance (Cm). The current Im can be amplified by an input stage 1305 with gain k, and applied to a demodulator unit (DM) 1307. The DM 1307 is depicted functionally as a multiplier. Generally, the DM 1307 multiplies the incoming signal (Im) by the excitation signal to obtain a rectified output and obtain better noise immunity, especially in the presence of low frequency noise. In applying the demodulating signal to DM 1307, sometimes a phase shifter 1309 is included to minimize the impact of delay through the sensor network 1303.

The rectified signal output from the DM 1307 is collected in a low-pass filter (LPF) 1311 to generate an output signal (Ux) that is proportional to the transferred charge (Im) (which in turn is proportional to the sensed capacitance, Cm). Usually, an integrator is used in role of the LPF 1311. The LPF 1311 output is digitized by an ADC 1313, and collected in a digital low-pass filter (DLPF) 1315.

The architecture of FIG. 13 can be considered a "charge accumulation" architecture, as charge is accumulated at the LPF 1311 that is proportional to a sensed capacitance (Cm). In the conventional charge accumulation system 1300, the sensor excitation is periodic. The quantity of excitation charges that are collected in the LPF 1311 (and after that in the DLPF 1315) define the behavior of the system under a noise influence. The number of excitation periods accumulated and the excitation frequency can define the integration time.

The ADC conversion (ADC 1313) can take various forms. One ADC method can involve direct conversion. An incoming analog signal is compared to a quantized reference value. Another method can transform the integrated value to some other form. For example, a charge balancing type procedure can be used. In a charge balancing procedure, an initial charge corresponding to the integrated value can be balanced by application of reference current. The amount of time needed to balance out the value can then be digitized (i.e., by a counter, or the like).

FIG. 14A shows a conventional charge balancing system 1400 in a functional schematic diagram. A charge balancing system 1400 can include items like those of FIG. 13, and such like items are referred to by the same reference character but with the leading digits being "14" instead of "13". Unlike FIG. 13, THE conventional system 1400 of FIG. 14 shows an integrator 1417, comparator 1419, and current source 1421, which can apply a current (represented by adder 1423) to the input signal at the input of the integrator 1423. A charge balancing system 1400 is understood to switch between opposite states after each charge balancing operation. Such system can be understood to perform input charge accumulation (integration) and charge balancing with a reference source at the same time.

It is noted that while a particular DM unit is not included in system 1400, demodulation can occur "virtually", by operation of inverting current source, which can alternate the direction (sign) of a reference current source (e.g., charge balancing current Iref) synchronous with changes in the excitation signal.

The noise response of the conventional system 1400 will now be described. In general there can be two kinds of noise sources: internal and external. Internal noise can arise from the self-noise of active components, from charge transferred from switching circuit via parasitic capacitance, and from noise arising from power supplies. In FIG. 14A, such internal noise sources are reduced to an equivalent noise source Enc 1425 applied on at the input of comparator 1419 via a summing operation. External noise can penetrate into the measuring circuits via parasitic capacitance with sensors cells. Further, liquid crystal display (LCD) noise (if the system is utilized with a touchscreen) and charger noise are representative instances of external noise. In FIG. 14A, external noise sources are reduced to an equivalent source Ene connected to a sensors node via capacitor Cf within sensor network 1403.

The frequency response of the channel at the comparator input can be given as:

$$Gconv(f) = Gf(f) \cdot Gint(f)$$

where Gf(f) is the transfer function of the noise source chain; Gint(f) is the integrator transfer function.

In a first approximation, Gf(f) and Gint(f) can be conceptualized as a high-pass and low-pass filters, respectively. In such a case, the frequency response of the system (i.e., channel) 1400 at the input of the comparator 1419 can be represented as a constant value:

$$|Gf(f)| \equiv \alpha \cdot f; \ |Gint(f)| \equiv \beta \cdot \frac{1}{f}; \ \rightarrow |Gconv(f)| \cong \text{constant.}$$

In other words the form of the noise spectrum at the sensing source and at the comparator input can be the same. As such, it is possible to analyze noise effects by moving all such noise sources to input of the comparator 1419.

FIG. 14B are timing diagrams showing errors that can result from noise in a system like that of FIG. 14A. A conversion operation (i.e., capacitance sensing operation) can begin with each transition of an excitation signal TX (points A and A'). Since the excitation signal acts on the integrator via differential gain, the integrator output voltage (Uint) changes fast from a reference voltage (Uref) up to a maximum value. A signal "Gate" connects a reference current (i.e., charge balancing) source to the integrator simultaneously. Thus, following the initial rise in value, Uint will start to discharge. Such a discharge stops when an integrator output voltage equals the reference voltage (Uref). Such stopping (i.e., charge balance) is marked as D and D' in FIG. 14B.

FIG. 14B shows the influence of external noise sources (Enc) and internal noise sources (Ene). Noise is shown only at the end of a charge balancing operation. It is understood that such noise can be present all along the waveforms and is just shown as the Uint approaches Uref, for illustration.

FIG. 14B shows how similar conversion operations occur under the different noise sources. As shown, effects of noise can result in a shortening of the charge balancing time (shown as point B for noise Enc, and point C for noise Ene). In other words, the normal distribution of noise would change a value of distributions to be skewed to one side (i.e., shorter charge balancing time, or smaller count values).

It is noted that the type of distribution does not change if a slew rate of noise in the comparator input is less than the integrator output voltage slew rate at the end of a discharge operation. In this way, integrator discharge speed and noises spectrum may significantly impact converter behavior in a conventional charge balancing system.

FIG. 14C is a timing diagram showing how a conventional charge balancing system can have increasing error in subsequent conversions. In particular, there can be a doubling in error from the previous conversion to the following conversion. In response to noise, the discharge process can stop too early (point B). At this point, the integrator output voltage (Uint) is different than reference voltage (Uref). Therefore, the following conversion begins from this (non reference) level and the error from first conversion (corresponding to point A to B) is carried into the second conversion, which, due to noise, can cut short the balancing time even more (point A' to B'). Thus, an error of a second conversion (−Δns') can be greater than that of a first conversion (−Δns).

FIG. 15 shows a conventional relaxation converter based system 1500 with a charge-charge balancing technique. System 1500 can include two operational amplifiers (op amps) OA0 and OA1. OA0 in combination with an integrating capacitor Cint can be used as an active integrator, with the capacitor Cint in a feedback loop. OA1 can serve as a comparator 1519 to indicate the moment when charge balancing occurs in the integrating capacitor Cint. Non-inverted inputs of OA0 and OA1 can be connected to a reference voltage Uref, which can be at a point close to a middle of the supply voltage. A signal from a sensor (Im) is applied directly to an input of the integrator.

A current digital-to-analog convertor (I-DAC) 1521 generates a balancing current (Iref) that is applied to the integrator input with switch 1529, which is controlled by signal Gate. Digital code Ni establishes a magnitude of the balancing current (Iref). Balancing begins with excitation edge (rising or falling edge of Tx) and stops when the comparator determines that the integrator output voltage (Uint) has crossing the reference level (Uref). The next edge of Tx is a start point for the following conversion.

Convertor control logic 1527 generates signals that control the excitation source (Tx) and a signal "Polarity", which switches the direction flow of the balancing current. These two signals (Tx and Polarity) are strongly correlated. In the case of a large noise event that changes the integrator output voltage to a polarity opposite to that of the excitation signal, the balancing current will be of the wrong polarity, reinforcing the excitation signal and driving the integrator into saturation. Control logic 1527 can use the comparator output to define the balancing current polarity to prevent integrator saturation in a large noise environment. In particular, when a balancing current is of the wrong polarity, the conversion result is represented as negative number, indicating it is an invalid measure.

A convertor resolution is defined as product of balancing time and (a counting) clock frequency. The clock is used to measure the balancing time by counting number of the clock pulses occurring over the balancing time period. The balancing time is limited by the excitation signal half-period duration. This means that it can be difficult to obtain a high resolution of the convertor when using a high frequency excitation signal.

The result of conversion of one excitation edge can be given by:

$$Nx = \frac{Uex \cdot Cx}{Ibal} \cdot Fclk;$$

Where Uex is the excitation voltage; Cx is the sensor capacitance; Ibal is the balancing current; and Fclk is the clock frequency. It should be noted that the integrating capacitor value is absent in the convertor equation above. This capacitance defines the integrator output voltage swing only. The structures based on the direct conversion of integrator output (noted above) are sensitive to the integrating capacitor value.

A conventional relaxation type charge balancing system like that of FIG. 15 can have the following advantages: insensitivity to integrating capacitor value; overload immunity; a simple structure; and cycle by cycle processing possibilities. Drawbacks to such a system can be: large quantization noise; response and degradation are worse as noise levels grow; such systems need a bi-directional reference current source; external noise can provoke synchronization or resonance; and many parameters define ringing frequency.

BRIEF DESCRIPTION OF THE DRAWINGS

FIGS. 3A and 2B are block schematic diagrams of system according to another embodiment.

DETAILED DESCRIPTION

Various embodiments will now be described that show capacitance sensing systems and methods that can provide high resolution, linearity and dynamic range, without the need for a baseline compensation circuit. Embodiments can integrate and discharge a sense signal in a same conversion to generate a conversion result. Remainders of a conversion operation (i.e., quantization errors and/or those arising from noise), can be retained for the next conversion (i.e., carried forward), with the remainder of one conversion tending to be offset by that of the next conversion.

Figure 1A:
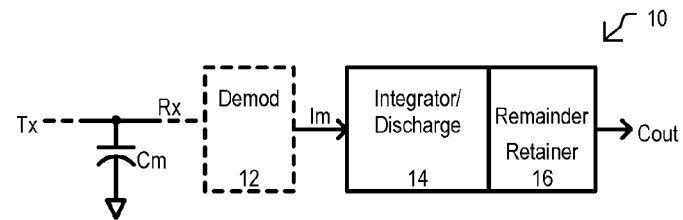
FIG. 1A is a block diagram of a system according to an embodiment.

FIG. 1A is a block diagram of a system according to one embodiment. A system 10 can receive a signal Rx, which can be generated in response to a time varying excitation signal Tx applied to a capacitance Cm. Mutual capacitance (Cm) can vary according to an object proximity, and Rx can vary according the mutual capacitance (Rx ≡Cm). In response to the input signal Im, system 10 can generate an output value Cout having a duration corresponding to a sensed capacitance (Cout≡Cm).

A system 10 can include an integrator/discharger 14, remainder retention section 16, and optionally, a demodulator 12. Integrator/discharger 14 can integrate an input signal (Im), which can correspond to signal Rx, starting at a reference level. In the same conversion the value can be discharged. Thus, integrator/discharger 14 can generate a value (Uint) that rises (with respect to a reference level) and then falls within the same conversion. It is understood that such integration and discharge operations can be of any polarity. Thus, in an alternate embodiment, a value can be initially "charged" below a reference level and then "discharged" back up to the reference level.

Remainder retention section 16 can retain any resulting remainder value resulting from a conversion, for use in a next conversion. In some embodiments, such a remainder can be generated by generating output value Cout with a quantizing operation. In other embodiments, a remainder can be generated by noise.

A value Cout will terminate when an integrated/discharged value is near, or at, a reference level. As will be shown in more detail below, in some embodiments Cout can be terminated in synchronism with a reference clock. Thus, a conversion starting point for conversion operations can include a quantization error level from a previous conversion operation. This is in contrast to many conventional approaches the completely discharge a sensed value back to a reference level.

A demodulator 12 can demodulate input signal Rx to generate an input signal (Im). Such demodulation can be according to signal Tx.

Having described system components in FIG. 1A, the operation of such a system will be described with reference to FIGS. 1B and 1C.

Figure 1B:
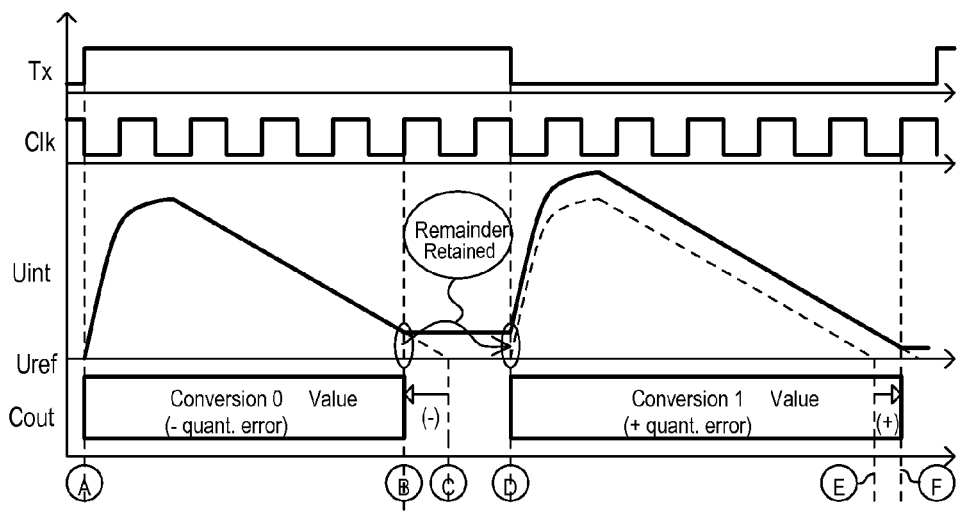
FIGS. 1B and 1C are timing diagrams showing operations for a system like that of FIG. 1A.
Figure 1C:
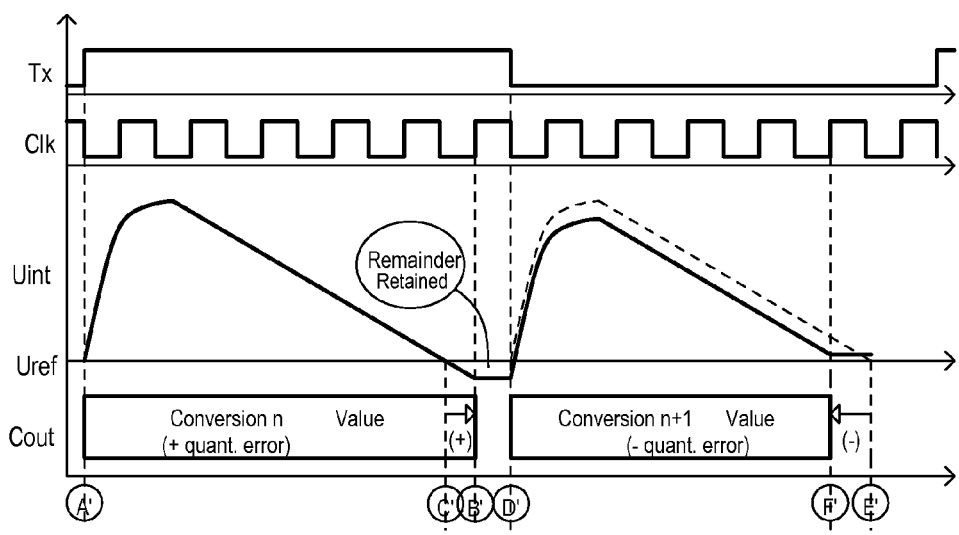

FIGS. 1B and 1C are timing diagrams showing an excitation signal Tx, clock signal Clk, an integrated (and discharged) value Uint, and an output value Cout. Conversions can take place during each half cycle of Tx. Clock signal Clk can provide a quantization point (i.e., end point) for each conversion. Value Uint represents the integration and discharge of each conversion operation. Discharge is stopped in synchronism with clock signal Clk. An output value Cout can represent the time between the start of each conversion (at the start of each transition of Tx) and its termination point. FIGS. 1B and 1C show a quantized value by a solid line, and a nominal value (i.e., a value which discharged completely to Uref) with a dashed line.

FIG. 1B shows a first conversion (Conversion 0) that starts at point A. Thus, value Uint rises from Uref in response to the integration of an input value, at the same time a discharge operation can start. Thus, value Uint can peak and then start to fall as discharging overtakes integration. Without quantization, such a conversion would end at point C. However, due to quantization, conversion ends at point B, prior to point C. Thus, a resulting in a remainder (referred to hereinafter as a quantization error) that is negative (i.e., the Cout value is shorter than ideal).

Referring still to FIG. 1B, a resulting quantization error from Conversion 0 can be retained for the next conversion. Thus, the solid waveform Uint remains above the Uref level. Accordingly, in the next conversion (Conversion 1), an integration starting point includes the retained quantization error, starting at a level above Uref (point D). Due to this starting point, when the value is quantized in the second conversion, the conversion ends at point F and not point E. The resulting remainder (e.g., quantization error) is positive (i.e., the Cout value is longer than nominal), opposite to that of the previous conversion.

FIG. 1C shows another conversion (Conversion n) that starts at point A'. FIG. 1C shows conversions having an opposite remainder to those of FIG. 1B. In particular, conversion ends at point B', after the nominal point C', for a positive remainder. The positive remainder is retained, resulting in a next conversion (Conversion n+1) starting at a point below Uref. Due to this starting point, when the operation is quantized, conversion ends at point F' and not point E', for a negative remainder, opposite to that of the previous conversion.

Figure 1D:
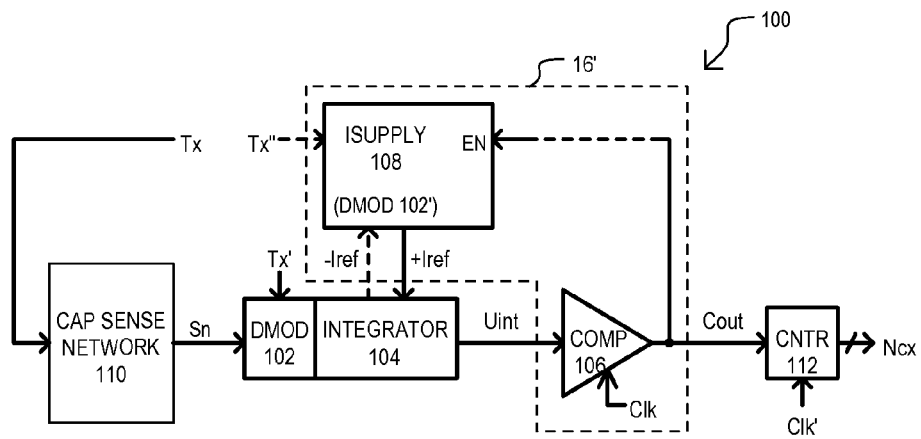
FIG. 1D is a block schematic diagram of a system according to another embodiment.

FIG. 1D is a block schematic diagram of a system 100 according to another embodiment. A system 100 can include an integrator/discharging (referred to hereafter as only "integrator") circuit 104, a demodulation section 102, and quantizing/remainder retention section 16'. Section 16' can include a comparator 106, and a current supply circuit 108. A system 100 can receive a sense input signal (Sn) from a capacitance sense network 110 and generate a comparator value (Cout) having pulses with a duration corresponding to a sensed capacitance. A sense input signal (Sn) can be generated in response to a time-varying excitation signal Tx. In a very particular embodiment, output value Cout can be applied to a counter circuit 112, which can generate a count value Ncx representing a sensed capacitance.

A demodulation section 102 can demodulate an input signal (Sn) according to a signal Tx', which can be synchronous to an excitation signal Tx. In some embodiments, a demodulation section 102 can include a switch network that connects a sense signal (Sn) to an integrator circuit 104 in synchronism with the excitation signal Tx.

An integrator circuit 104 can integrate a demodulated sense signal. In addition, such an integrated value can be subject to reference currents (+Iref and/or −Iref) in a discharge operation (i.e., charge balancing). In some embodiments, integration and discharge a simultaneous. Reference currents (+Iref/−Iref) can be provided from current supply circuit 108. An integrator circuit 104 can include a single ended input, or can a differential integrator with differential inputs. An integrator circuit 104 can include, or be connected to, one or more integrating capacitors.

A comparator 106 can compare a value (Uint) output from an integrator circuit 104 to a predetermined value, to generate output signal Cout. However, signal Cout can be driven between levels in synchronism with a clock signal Clk (i.e., it is quantized). Thus, in contrast to an un-synchronized comparator, a comparator output Cout can transition prior to value Uint value crossing a comparator threshold and/or after Uint crosses a threshold, depending upon a state of the clock signal Clk and the integrating/discharge operation occurring within integrator circuit 104.

A current supply circuit 108 can provide one or more reference currents to provide charge balancing (discharging) of output value Uint. In some embodiments, a current supply circuit 108 can provide a reference current that can "switch directions" with respect to an integrating capacitance. In other embodiments, a current supply circuit 108 can include switch elements and/or logic to alter how a reference current is applied to an integrating capacitance (i.e., switch which capacitor terminals it is applied to). In still other embodiments, a current supply circuit can provide two reference currents that flow in opposite directions with respect to an integrator circuit 104. A switching of reference current directions and/or the initial application of reference currents to an integrating capacitance can be synchronous with an excitation signal (Tx"). Thus, such operations can be considered another form of demodulation (102') using an excitation signal.

A reference current provided current supply circuit 108 can be terminated according to comparator output Cout. As noted above, Cout is synchronous with clock signal Clk. Thus, the termination of a discharge operation can be considered to be "quantized" as described above in FIGS. 1B/C, resulting in some remainder (referred to as a quantization error). This remainder is retained, and included in a subsequent conversion operation.

In a sense operation, conversions can take place between each transition of an excitation signal (Tx). In a conversion operation, signal Sn can be generated in response to excitation signal Tx. Signal Sn can be demodulated according to Tx, and applied as an input to integrator circuit 104. By operation of integrator circuit 104, Uint can be driven to a high level. At the same time, current supply circuit 108 can provide a reference current to charge balance the integrated signal. As Uint is near the reference level, the output Cout of comparator 106 can transition, in synchronism with Clk, to terminate the reference current, and end the conversion operation.

In a next conversion operation, a system 100 can operate as described above. However, a direction of a charge balancing (i.e., reference) current switches in synchronism with an excitation signal. Further, a signal Sn can vary in an opposite direction. As noted above, synchronizing a comparator output Cout with signal Clk can introduce a remainder (quantization error), but such remainders can accumulate in beneficial fashion. For example, if a quantization error is positive (e.g., plus one bit), a quantization error in a next conversion is more likely to be negative (e.g., −1 bit), and vice versa. In an accumulation of conversion values, quantization errors, to total error tends to remain at one bit or less.

Figures 2A, 2B:
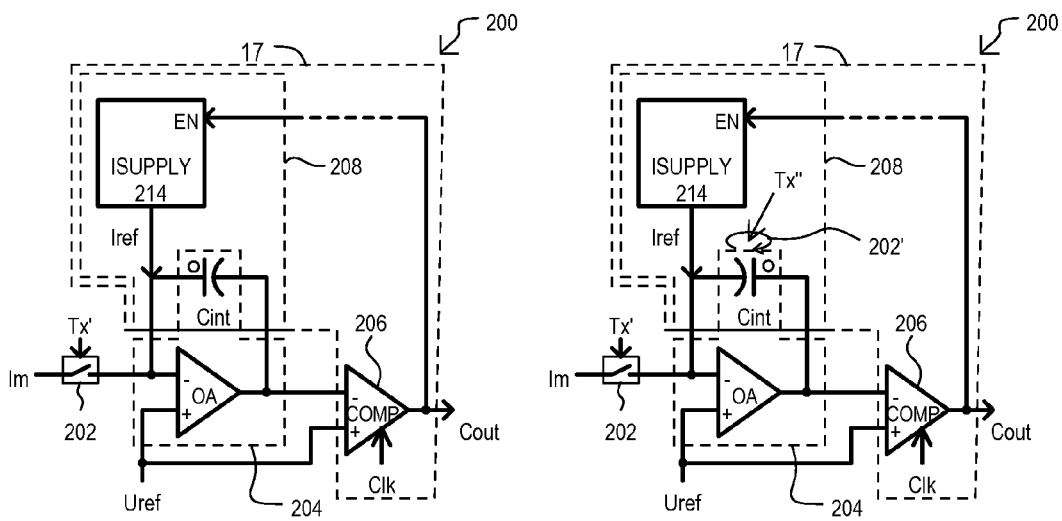
FIGS. 2A and 2B are block schematic diagrams of system according to a further embodiment.

FIGS. 2A and 2B are block schematic diagrams of a capacitance sense system 200 according to another embodiment. FIGS. 2A/B show a system in two consecutive conversions. System 200 can receive an input signal (Im) generated in response to a time varying excitation (e.g., transmit) signal, that represents a capacitance. In response to such an input value, system 200 can generate an output value Cout, having a duration corresponding to the sensed capacitance.

System 200 can include a demodulator section 202, integrator/discharge circuit 204, and quantization circuit 17 (which can include comparator 206 and current supply section 208). A demodulator section 202 can receive an input signal Im, and pass such a signal to integrator circuit 204 according a timing signal Tx', which can be synchronous with the excitation signal that generates the input signal (Im).

An integrator circuit 204 can include an op amp (OA) with an integrating capacitor (Cint) connected in a negative feedback path. An inverting input (−) of the OA can receive the input signal from demodulator section 202, and in addition, a charge balancing current (Iref) from a current supply circuit. A non-inverting input (+) of the OA can receive a reference voltage Uref. An output of the OA can be applied to a first input of comparator 206.

Comparator 206 can compare an output of integrator circuit 204 (which can undergo integration/charge balancing) to the reference voltage Uint to generate a comparator output signal Cout. However, transitions in output signal Cout are synchronized with a clock signal Clk. Thus, comparator output signal Cout can have a duration corresponding to a sensed capacitance. In particular embodiments, a counting circuit (not shown) can utilize signal Clk (or multiples/fractions thereof) to measure the duration of Cout (and hence the measured capacitance).

Current supply section 208 can include a current supply circuit 214 and circuits (i.e., a switching network) that can vary how a charge balancing current (Iref) is applied to an integrating capacitor (Cint). Further, current supply section 208 can terminate a reference current in response to Cout.

As noted above, FIG. 2A shows a system 200 configured for one conversion. In this conversion, current supply section 208 can apply a reference current (Iref) to one terminal (connection) of the integrating capacitance (Cint), indicating by the small circle.

Referring to FIG. 2B, in a next conversion, current supply section 208 can apply the reference current to the other terminal of the integrating capacitance (Cint) (i.e., the terminal without a circle). Further, such a switching of a current direction can be synchronous with the excitation signal (Tx"), and thus also be considered a demodulation operation (represented by 202').

Figure 3A:
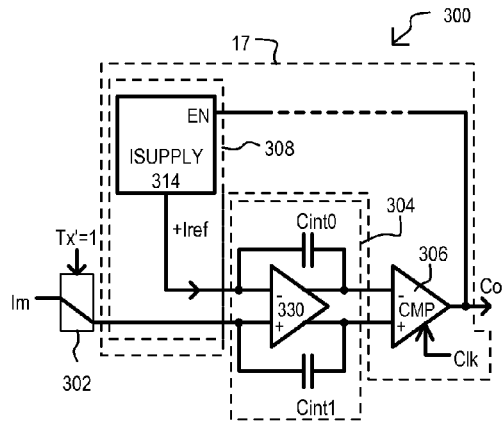
Figure 3B:
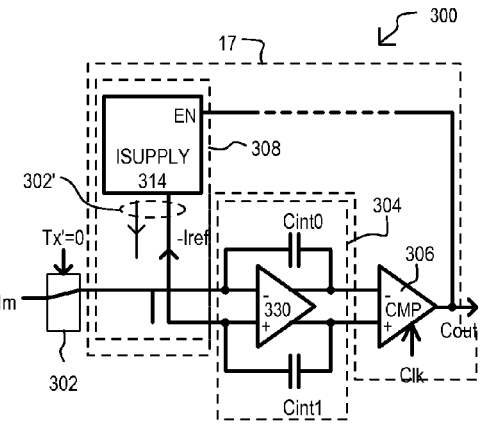

While embodiments can include a single-ended integrator configuration, as shown in FIGS. 2A and 2B, other embodiments can include a differential integrator, as shown in FIGS. 3A and 3B.

FIGS. 3A and 3B are block schematic diagrams of a capacitance sense system 300 according to another embodiment. Like FIGS. 2A/B, FIGS. 3A/B show a system in two consecutive conversions. System 300 receives an input signal (Im), generated by an excitation signal, and provides an output signal Cout.

System 300 can include a demodulator section 303, differential integrator circuit 304, and quantization circuit 17 (comparator 306 and current supply section 308). A demodulator section 302 can receive an input signal Im, and apply such a signal to different differential inputs of the differential integrator circuit 304 according to a signal Tx'. Signal Tx' can be synchronous with the excitation signal (i.e., Tx) that generates the input signal (Im).

Differential integrator circuit 304 can include differential amplifier 330, a first integrating capacitor (Cint0) connected in an inverting feedback path, and a second integrating capacitor (Cint1) connected in a non-inverting feedback path.

Comparator 306 can have inputs connected to the differential outputs of differential integrator circuit 304, and can generate output signal Cout in response. As in the case of FIGS. 3A/B, transitions in output signal Cout are synchronized with a clock signal Clk (which can be a counting clock, or multiples/fractions of a counting clock in particular embodiments).

Current supply section 308 can include a bi-directional current supply circuit 314 and circuits (i.e., a switching network). Depending upon the conversion taking place, a reference current (+Iref) can be provided that flows into differential integrator circuit 304, or a reference current (−Iref) that flows out of differential integrator circuit 304. Reference currents (+Iref/−Iref) can be terminated in a conversion operation by signal Cout. A switch in current direction by current supply section 308 can be synchronous with an excitation signal, and thus also be considered a demodulation operation (represented by 302'). Thus, it is understood that a "discharge" current can be a current that flows into an integrating capacitance in one conversion, but can be a current that flows out of (i.e., current sink) the integrating capacitance in another conversion.

FIG. 3A shows system 300 configured for one conversion. In this conversion, demodulator section 302 can apply input signal (Im) to a (+) input of differential integrator circuit 304. At the same time, current supply section 308 can apply a reference current (+Iref) to a (−) input of differential integrator circuit 304.

Referring to FIG. 3B, in a next conversion, demodulator section 302 can apply input signal (Im) to a (−) input of differential integrator circuit 304. At the same time, current supply section 308 can apply a reference current (−Iref) to (i.e., sink current from) a (+) input of differential integrator circuit 304.

To understand the operation of embodiments in more detail, charge balancing operations for various system configurations/architectures will now be described.

Figure 4:
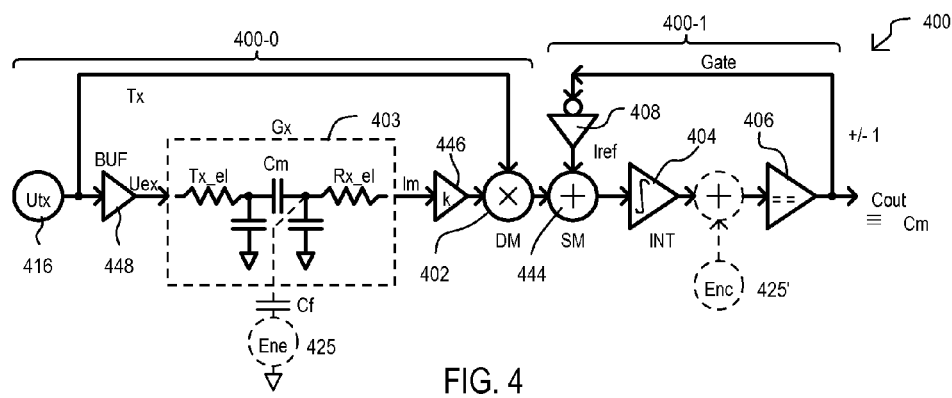
FIG. 4 is a functional schematic diagram of a capacitance sensing system.

FIG. 4 shows a capacitance sensing system 400 in a functional schematic diagram. A system 400 can be conceptualized as including a demodulation portion 400-0 and a charge balancing converter portion 400-1.

Demodulation portion 400-0 can include an excitation source Utx 416, a buffer 448, a sensor network 403, input gain stage 446, and demodulator 402. Excitation source 416 can generate a time varying signal Tx that can be drive by buffer 448 on sensor network 403. In one very particular embodiment, a sensor network 403 can include transmit electrodes arranged in one direction and receive electrodes arranged in another direction. A mutual capacitance (Cm) between such electrodes can vary according to the proximity of an object (i.e., finger). According to a mutual capacitance (Cm), excitation signal Tx can induce charge (current signal Im) output from sensor network 403. Signal Im can be amplified by input gain stage 446 and applied to demodulator 402. Demodulator 402 can demodulate the amplified Im value with the excitation signal Tx (which may be phase shifted prior to such application).

A charge balancing portion 400-1 can include an integrator input (summer 444), integrator 404, comparator 406, and current supply section 408. Integrator input 444 can receive the demodulated signal from demodulator 402, as well as a charge balancing (i.e., discharge) current (Iref). Integrator 404 can perform an integration operation on its input (which can include both integrating and discharging). An output of integrator 404 can be connected to comparator 406. Comparator 406 can generate an output signal Cout having a pulse duration proportional to a sensed capacitance (Cout≡Cm). Further, the comparator output Cout can terminate the charge balancing current. Current supply section 408 can provide the charge balancing current (Iref) to integrator input 444 with each conversion operation. In some embodiments, a current (Iref) can switch directions synchronously with an excitation signal, and thus serve as a demodulator as well.

To understand operations of the embodiments herein, the operation of the system 400 will be described without comparator synchronization (i.e., comparator 406 output Cout transitions solely according to a comparison result) as well as with synchronization (i.e., comparator 406 output Cout transitions according to a comparison result but synchronous with a clock signal—resulting in quantization of an output signal). Such a description will be with reference to FIGS. 5A to 5C.

Figure 5A:
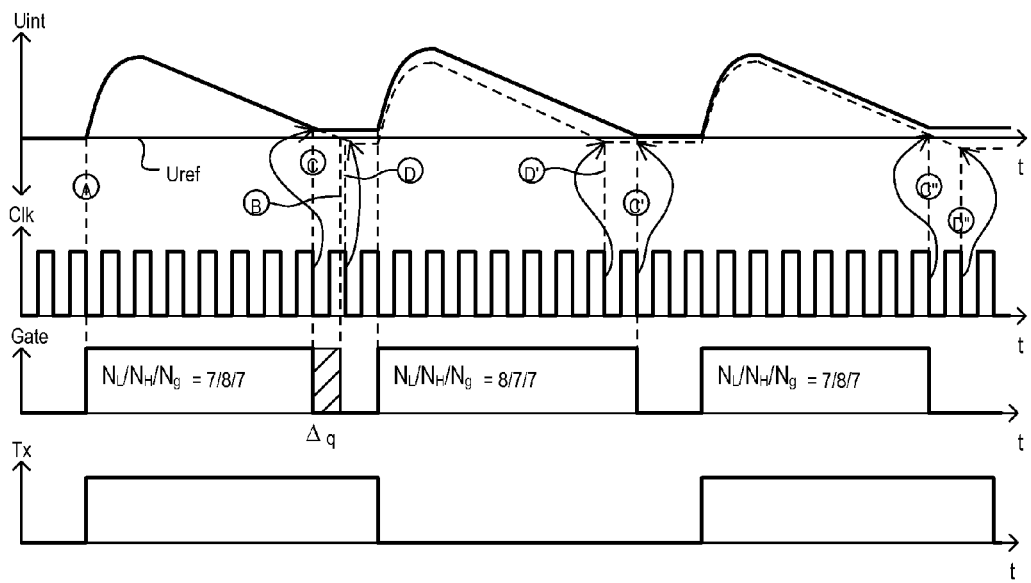
FIGS. 5A to 5C are timing diagrams showing system responses to quantization and noise error according to various embodiments.
Figure 5B:
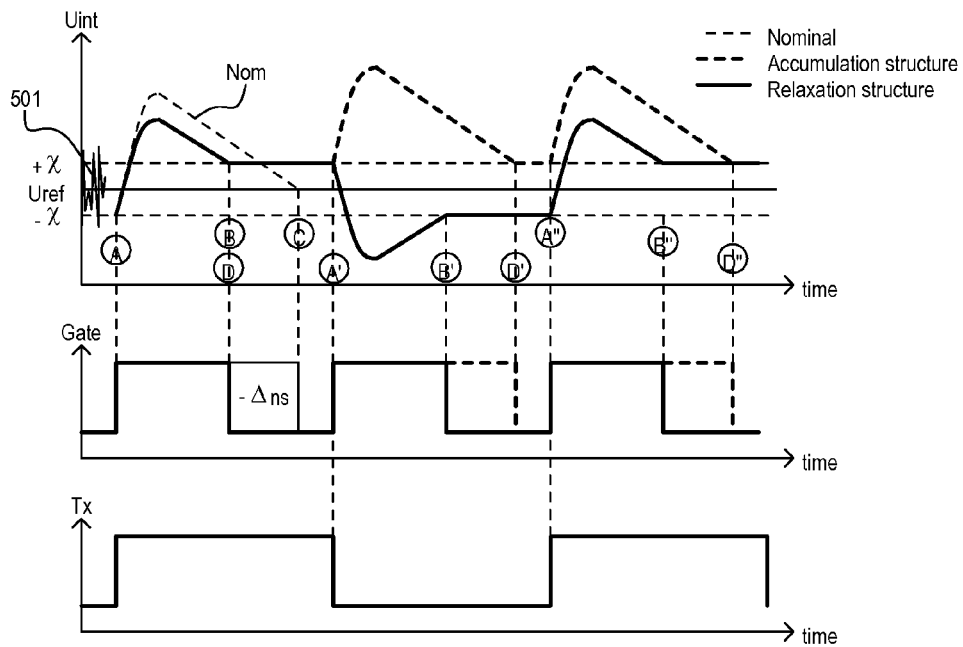
Figure 5C:
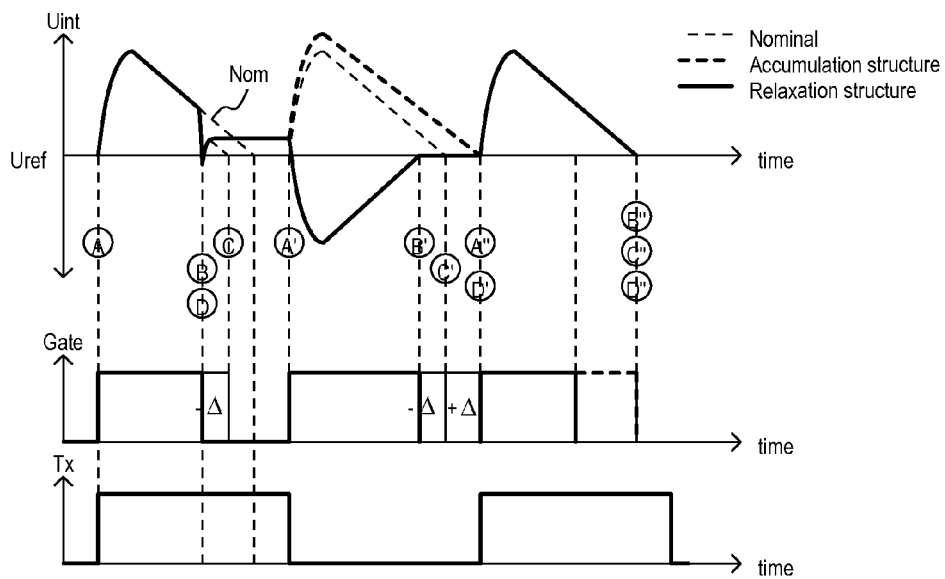

FIG. 5A is a timing diagram that shows: a clock signal (Clk) that synchronizes a comparator output, and is also used to generate a count value corresponding to the capacitance; a Gate signal (i.e., Cout) that terminates a charge balancing current; and an excitation signal (Tx). FIG. 5B is a timing diagram showing waveforms for Uint, Gate and Tx in the presence of noise having a defined average amplitude ($-\chi/+\chi$). FIG. 5C is a timing diagram showing waveforms for Uint, Gate and Tx in the presence of a large noise spike.

Referring now to FIG. 4 in combination with FIG. 5A, when a system 400 operates without comparator synchronization, integrator discharge (i.e., the charge balancing current) stops the moment the integrator output voltage reaches a reference voltage (point B). Thus, without comparator synchronization, a conversion operation occurs between points A and B, and yields a count value Ng of 7 (i.e., there are 7 complete clock cycles between points A and B).

If it is assumed that conversion operations are systematic processes, then a systematic quantization error can arise as conversion results are accumulated. The accumulated result will be always less than the sum of the same number of the nominal conversion values Nx. Thus, a maximum quantization error value can be given by:

$$\Delta Q_{max} = \Delta q \cdot N$$

where $\Delta q$ is the quantization step; and N is the number of the accumulated conversion.

The above relationship is true when a quantization step is larger than internal and external noises. However, it can be very difficult to reach such low noise levels with a sufficient resolution in practical systems. Accordingly, in an evaluation of such sensing systems, it can be assumed the systems are stochastic, collecting a quantization error as a random value. Further, a probability distribution of a quantization error in such systems is assumed to be uniform. A signal-to-quantization noise ratio can be estimated as:

$$SNR = \frac{Kns}{2 \cdot Kci \cdot \sqrt{\frac{2}{3}}} \cdot \frac{Fclk}{Ftx} \cdot \frac{Kcx}{Ssq} \cdot \sqrt{M} ; \quad (1)$$

where M is the number of Tx periods while the conversion results are accumulating; Fclk is the reference clock frequency; Ftx is the excitation TX signal frequency; Kns is the coefficient of noise suppression with multiphase (value equal to 1 if the single phase technique is used); Ssq is the sum of the elements in the multiphase sequence (value equal to 1 if the single phase technique is used); $Kcx = \Delta Cm/Cm$ is the sensor sensitivity (Cm is the sensors mutual capacitance and $\Delta Cm$ is a change in this capacitance at a touch); Kci is the confidence interval coefficient (99% of the samples with normal distribution of are in the interval $\pm 2.5\sigma$, or Ksi=2.5).

Figure 15:
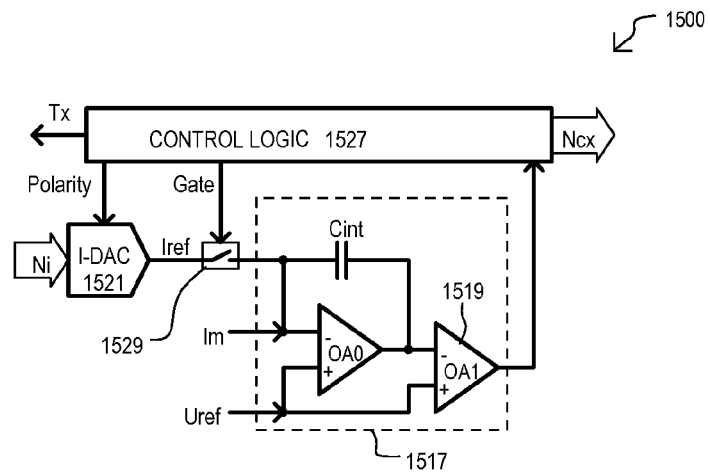
FIG. 15 is a schematic diagram of a conventional capacitance sensing system.

The above noise response can be the same for a system 400 without comparator synchronization as that of a conventional charge balancing system (e.g., FIG. 15). Thus, such systems can have a same quantization noise level.

Referring once again to FIG. 4 in combination with FIG. 5A, operations of a system 400 with comparator synchronization (i.e., with quantization), according to an embodiment, will now be described. Operating with comparator synchronization means that an integrator discharge (i.e., Iref) can stop at exactly defined moments in the time defined by pulses of the reference clock (Clk). Accordingly, a comparator 406 may trigger before the integrator output voltage (Uint) reaches the reference voltage (point C of FIG. 5A) or after Uint reaches the reference voltage (point D of FIG. 5A). An "early" comparator triggering is shown by the solid waveform of Uint. A "late" comparator triggering is shown by the dashed waveform of Unit.

As a result of such (late or early) comparator triggering, a remainder (referred to as a quantization error) can exist. However, as shown, this remainder is retained, and sets the starting point for the next conversion operation. By doing so, the remainder (i.e., quantization error) of the next conversion is likely to be in the opposite direction to that of the previous conversion. In particular, with reference to FIG. 5A, in a first conversion the "early" response (solid waveform) results in a count that is short with respect to the nominal case (by $\Delta q$). However, because the remainder is carried over (i.e., the second conversion starts above the Uref level), the resulting count of the next conversion can be longer than nominal, opposite to that of the previous conversion. Similarly, in a first conversion the "late" response (dashed waveform) results in a count that is longer than nominal. However, because the remainder is carried over (i.e., the second conversion starts below the Uref level), the resulting count of the next conversion can be shorter than nominal. Thus, after N conversions an accumulating quantization error can be within one quantization step.

In FIG. 5A, within the "Gate" waveform are count values for various modes of operation. Count $N_H$ designates the number of the reference clocks if a comparator triggers before the integrator crosses the reference voltage (solid waveform). Count $N_L$ designates the number of the reference clocks if the comparator triggers after the integrator crosses the reference voltage (dashed waveform). Count $N_g$ shows the number of reference clocks when operating without comparator synchronization. The sum of clock pulse counts after three conversions is within one bit for both cases of a synchronized comparator triggering ($N_H$ and $N_L$). But for operations without comparator synchronization ($N_g$) a quantization error is larger.

As noted above, if conversion operations are stochastic, comparator triggerings (either before or after crossing a reference level) can be random. Thus, a quantization error from one conversion carries forward to the next conversion where a new quantization error adds. In this way, if an amassed quantization error exceeds a quantization step, the next conversion result will include this bit (i.e., start conversion with the error).

An accumulating charge balance convertor with a synchronized comparator can result in a system that stores a quantization error from one conversion, and carries it forward to a next conversion. Thus, a quantization error can be within one bit after any number of conversion results. Accordingly, embodiments that include charge balancing with a synchronized comparator (i.e., quantization with retained error) can have this advantageous noise response.

Referring now to FIG. 4 in combination with FIG. 5B, operations of a system in a noisy environment will be described. Such responses can include those for system with an accumulation architecture, like those included in embodiments. In FIG. 5B, it is assumed that noise on a comparator input can have an average level given as $\pm\chi$ (around the Uref level). It is understood that noise can vary above and below these levels, as shown by 501 (i.e., noise like 501 exists throughout the time). Such noise can result in a comparator 406 triggering above or below the reference level (Uref). The difference between the reference voltage and $\pm\chi$ lines is proportional to the noise energy. The dashed waveform Nom shows a nominal integrator output voltage waveform (i.e., no noise) which shows the nominal conversion time from Point A to Point C.

The solid lines show the integrator output voltage for a conventional relaxation type architecture (e.g., FIG. 15). An input current integration can begins from level X with TX pulse (at point A). Integrator discharge begins simultaneously and then stops when the integrator output voltage (Uint) crosses the $+\chi$ line (Point B). Thus, in such a conventional relaxation architecture, in the presence of noise, a conversion time shifts to a smaller (than nominal) value (by $-\Delta$ns). Such a value grows as a noise level grows. In particular, an error value $-\Delta$ns can be proportional to $2\times\Delta_\chi$. In high noise environments, such a conventional system can see a degradation up to 50% response degradation.

In contrast, in an accumulation charge balancing behavior (shown by the dashed line in FIG. 5B, and as included in embodiments), adverse results from noise are reduced. In an initial conversion (point A to D), a remainder can exist as in the conventional relaxation architecture case. However, for each following conversion, the conversion can begin at around the $+\chi$ level and the average value of conversion results can reach the nominal value. In such a system, if a first conversion result is rejected, the following conversions will start around line $\chi$ and response degradation can be greatly reduced as compared to the conventional case (i.e., solid line).

Referring now to FIG. 4 in combination with FIG. 5C, operations of a system in response to a large noise spike will be described. Such responses can include those for systems with an accumulation charge balancing architecture, like those included in embodiments, as well as a conventional relaxation architecture.

The behavior of a system in response to noise spike penetration can be different between systems with a relaxation structure as compared to those with an accumulation charge balancing structure, such as embodiments herein. Integrators based on op amps with a limited pass-band may not suppress short spikes because an op amp output voltage cannot change fast enough to compensate for the spike with its feedback loop. Therefore, such spikes can occur on an op amp output resistance, and thus directly impact a comparator input. An example of such a conversion is shown in FIG. 5C.

In FIG. 5C, it is assumed that a noise spike occurs at point B. The dashed waveform Nom shows a nominal response. The solid line shows a response of a conventional relaxation architecture (e.g., FIG. 15). The bold dashed line shows a response of a charge balancing structure.

Referring to FIG. 5C, in the conventional relaxation case, the noise spike triggers the comparator transition at point B. Point B occurs prior to point C, which corresponds to a nominal response (i.e., a response for the waveform area taking into account that lost due to the noise spike). The comparator triggering stops the integrator discharge at point B, and the following conversion begins from a displaced level (above Uref). As shown, the following conversion of the conventional relaxation structure (point A' to B') repeats the previous error.

Referring still to FIG. 5C, in a charge balancing structure, a first conversion follows that of the conventional relaxation structure (i.e., comparator triggers early at point B). Further, the remainder is carried over as a starting point for the next conversion. However, unlike the conventional relaxation response, the accumulated error is in a direction opposite to that of the previous conversion (i.e., it adds to the waveform). Consequently, the average value of the two conversions contain little, if any, of the error provoked by the noise spike (assuming the noise spike enters the convertor through a capacitance.).

Thus, while a noise spike can introduce a double error (i.e., error in consecutive conversions) in both a conventional relaxation structure and a charge balancing accumulation structure, in the latter case, the error of the second conversion is opposite to that of the first conversion. Accordingly, in such cases (which are employed by embodiments), the sum of these errors tend to be zero.

FIG. 5C can also illustrated differences in an overload response. In case of a conventional relaxation convertor, a conversion following an overload situation will be reduced by the amount of charge left on the integrator at the transition of the start of the next conversion (i.e., transition of Tx), thus distorting the conversion value (making it shorter). In contrast, in the charge balancing case, left over unbalanced charge (the remainder) carries forward to following conversion and adds to a conversion result. Thus, in this case, following overload, a conversion does not lose information.

Having demonstrated how architectures according to embodiments can have advantageous quantization noise, and system noise responses, particular detailed embodiments will now be described.

Figure 6A:
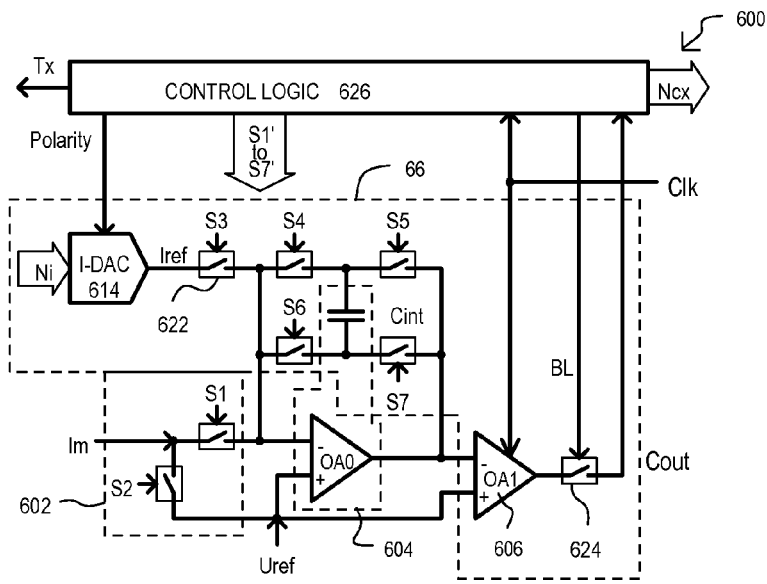
FIG. 6A is a block diagram of a system according to an embodiment.

FIG. 6A shows a system 600 according to an embodiment. A system 600 can include an integrator/discharge (referred to hereinafter as "integrator") circuit 604, a remainder retention section 66, an input switching section 602, and control logic 626. Integrator circuit 604 can include an op amp (OA0) and an integrating capacitance Cint. Op amp OA0 can have a non-inverting input (+) connected to receive a reference voltage Uref. An inverting input (−) can be connected (via switches) to capacitance Cint.

Remainder retention section 66 can include a comparator (implemented by op amp OA1), an output switch 624, a current digital-to-analog converter (IDAC) 614, and a switch network (SW3 to SW7).

A switch network (SW3 to SW7) can be controlled by control signals (SW1' to SW7') generated from control logic 626. A switches SW4 to SW7 can operate to switch the direction of (i.e., connections to) the integrating capacitance Cint within the negative feedback loop of OA0. In addition, switch SW3 can apply a reference (discharge) current from the IDAC 614 to the network (and hence to Cint). IDAC 614 can provide a discharge current (Iref) to Cint (via switch network SW3 to SW6) that is established by digital value Ni.

Comparator (OA1) can have one input (+) connected to receive a reference voltage Uref, while the other input is connected to an output of OA0 (i.e., the integrated/discharged value Uint). An output signal (Cout) from comparator OA1 can be synchronized with a clock signal Clk (i.e., quantized). Output switch 624 can isolate an output of the comparator (OA1) while switch network (SW3 to SW6) operates.

Input switching section 602 can include switches S1 and S2. Switch S1 can connect a capacitance sense input signal (Im) to the (−) input of OA0. Switch S2 can connect the (−) input of OA0 to reference voltage Uref as switch network (SW3 to SW6) operates.

Control logic 626 can generate: an excitation signal (Tx) to generate input signal (Im); a Polarity signal which can control the polarity of Iref provided from IDAC 614; controls signals S1' to S7', which control switches S1 to S7, respectively; a BL signal which controls output switch 624; and a count value Ncx corresponding to a duration of pulse Cout (i.e., a balancing time) which can represent a sensed capacitance.

Referring still to FIG. 6A, in a system 600 a demodulation function can be implemented by reversing connections of integrating capacitance Cint synchronous to excitation signal Tx. As noted above, such an action can be accomplished by operation of switches S4 to S7. Output switch 624 (operated by signal BL) can disconnect the comparator output from the convertor control logic (626) while connections to Cint are reversing, to prevent the comparator from sensing false sense signals that can arise from such switching.

Figure 6B:
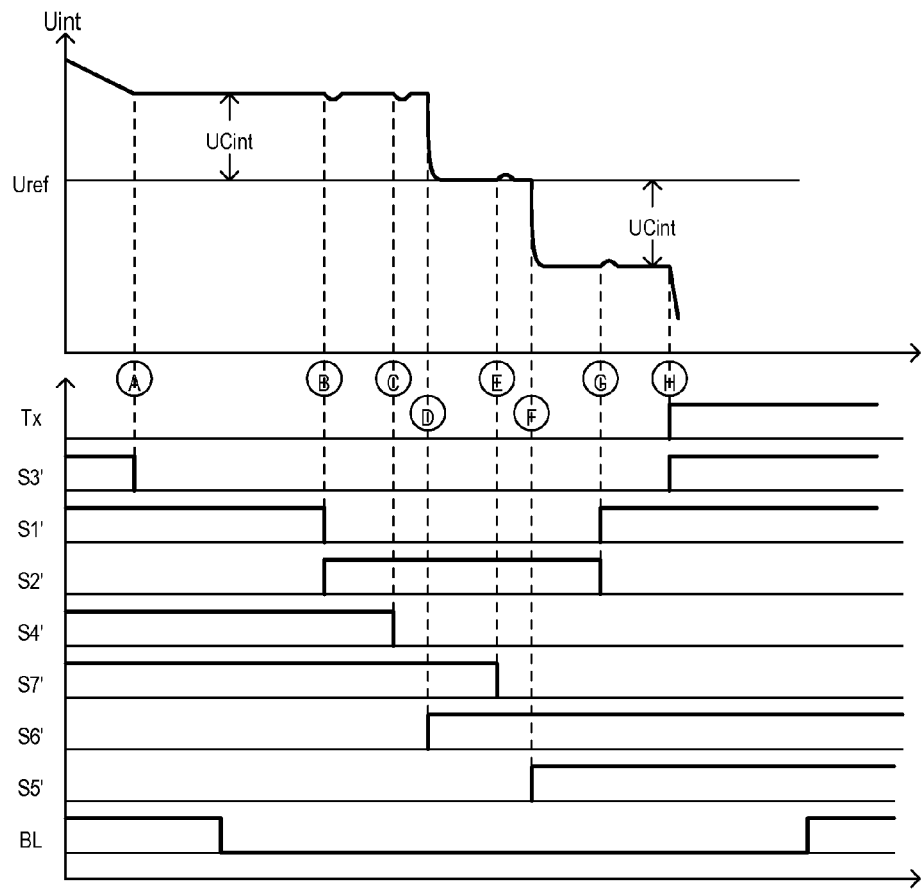
FIG. 6B is a timing diagram showing the operation of a system like that of FIG. 6A.

FIG. 6B is a timing diagram showing an integrating capacitance connection switching operation for an embodiment like that of FIG. 6A. FIG. 6B shows: an integrator voltage Uint (with respect to reference voltage Uref); a transmit signal Tx; switch control signals S1' to S7'; and signal BL. By operation of such switching, an orientation of Cint can be reversed, and an output of the integrator (i.e., output of OA0) can be held at the reference voltage level Uref.

Referring to FIG. 6B, in a first stage of an integrating capacitance (Cint) reversal, a reference current (Iref) can be isolated from Cint (point A), and the output of the comparator (606) is isolated from the control logic. Also at this time, the (−) input to the integrator can be connected to the reference voltage Uref (point B). Cint is then disconnected from the integrator input and feedback loop (point C).

In a following stage, one connection (i.e., second terminal) of Cint, can be connected an input of OA0 (point D). This same terminal can then be disconnected from the OA0 output (point E). The opposing connection (i.e., first terminal) of Cint can then be connected to the output of OA0 (point F). A (−) input to the comparator can be dis-connected to the reference voltage Uref, in order to once again receive an input signal Im (point G) at the start of the next conversion (point H).

The embodiment of FIGS. 6A/B may be applicable to for integrators with very fast amplifiers, where such amplifiers can react on fast variations of input signals while a reversing of the integrating capacitance Cint is underway.

Figure 7A:
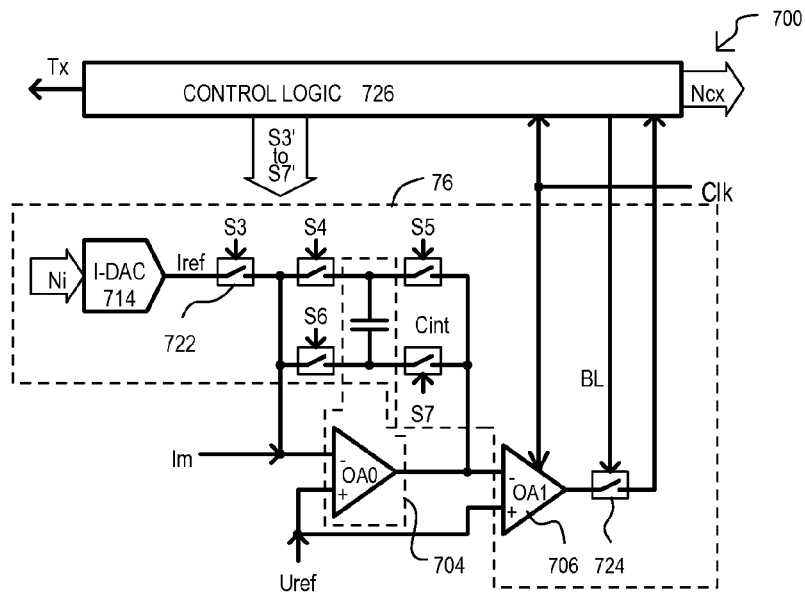
FIG. 7A is a block diagram of a system according to an embodiment.

FIG. 7A shows a system 700 according to another embodiment. A system 700 can include items like those of FIG. 6A, and such like items are referred to with the same reference character but with the first digit being a "7" instead of a "6".

System 700 differs from that of FIG. 6A in that it does not include an input switching section 602.

Figure 7B:
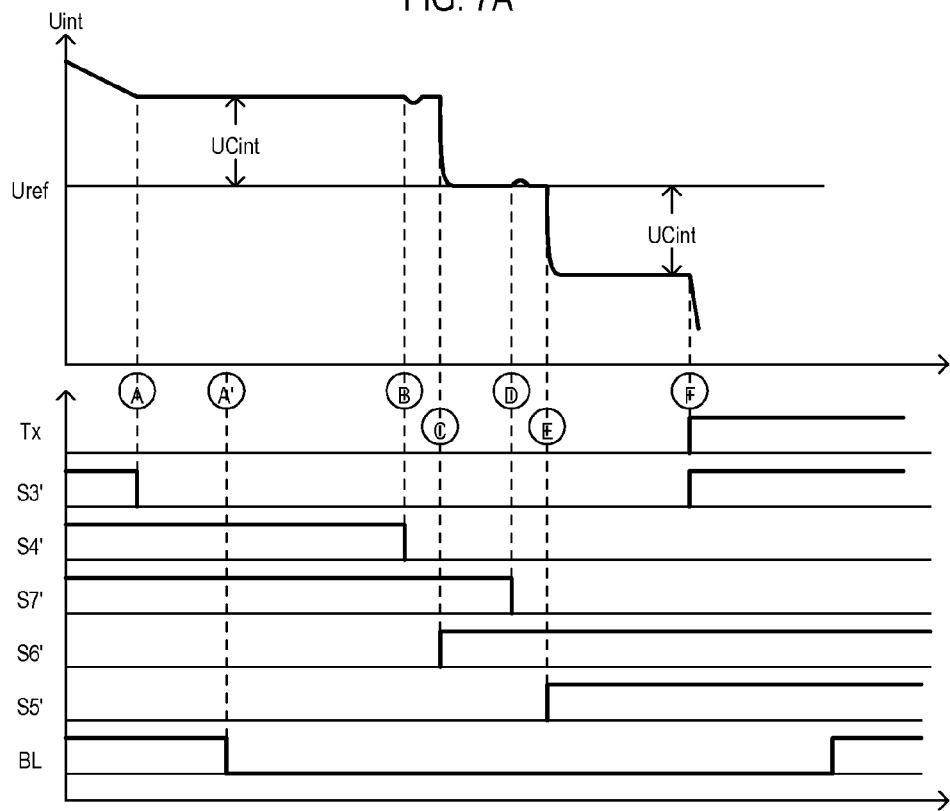
FIG. 7B is a timing diagram showing the operation of a system like that of FIG. 7A.

FIG. 7B is a timing diagram showing an integrating capacitance connection switching operations for an embodiment like that of FIG. 7A. FIG. 7B includes signals as described for FIG. 6B (without signals S1', S2').

Referring to FIG. 7B, in a first stage, a reference current (Iref) can be isolated from Cint (point A) and the output of the comparator (706) is isolated from the control logic (point A').

In a following stage, one connection (i.e., second terminal) of Cint, connected to an output of OA0, can be connected to an input of OA0 (point C). This same terminal can then be disconnected from the integrator output (point D). The opposing connection (i.e., first terminal) of Cint can then be connected to the output of OA0 (point E).

The embodiment of FIGS. 7A/B may be applicable to for integrators with slower operating amplifiers. Switches S7 and S6 can be on in an overlapping fashion, to hold the output on the Uref level, thus dispensing with the need for switches S1 and S2 (as in FIG. 6A).

Embodiments like that of FIGS. 6A to 7B can include drawbacks: having feedback loops of the integrator op amps being opened while the integrating capacitor is reversed; having a large number of switches in the signal path which can be source of additional errors; a parasitic capacitance of switches which can cause charge sharing with the integrating capacitance; and the integrating capacitor reversing routine can be complex, relying on strict control of switching. According to additional embodiments, such drawbacks can be addressed by with a differential charge converter type system. One such embodiment is shown in FIGS. 8A and 8B.

Figure 8A:
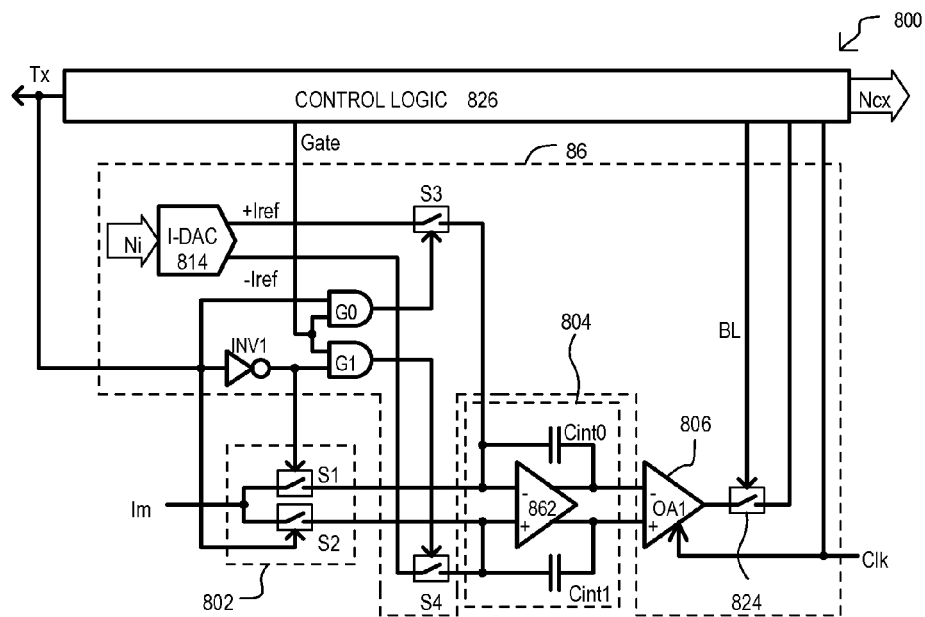
FIG. 8A is a block diagram of a system according to an embodiment.
Figure 8B:
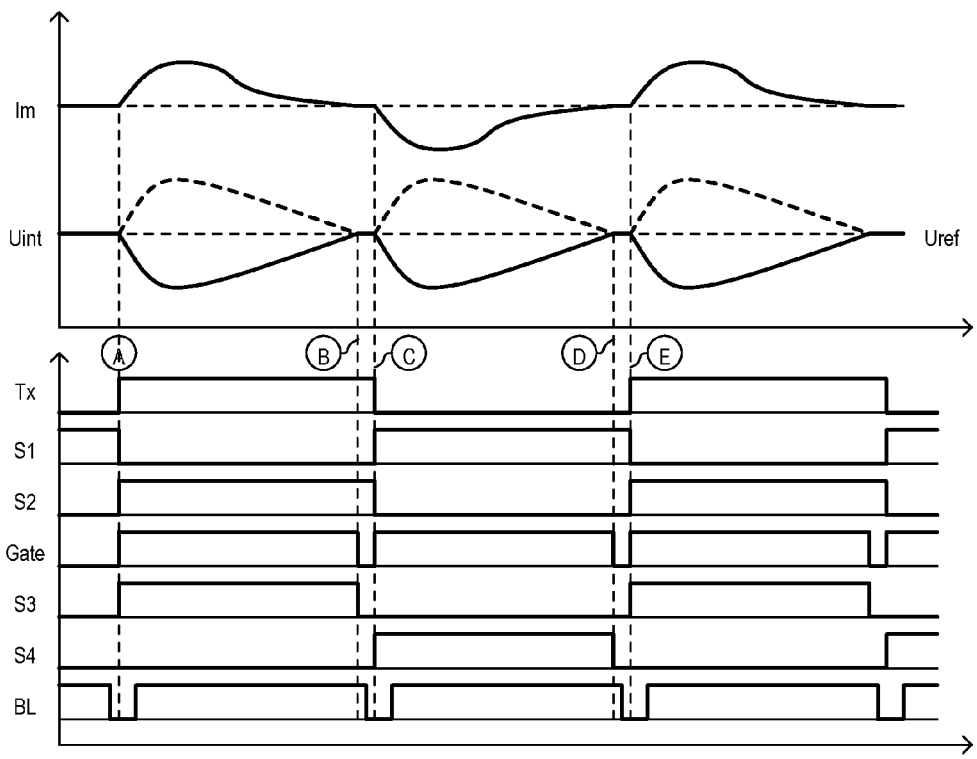
FIG. 8B is a timing diagram showing the operation of a system like that of FIG. 8A.

FIG. 8A shows a system 800 according to a further embodiment. A system 800 can include a differential integrator/discharge (referred to hereinafter as a "differential integrator") circuit 804, remainder retention section 86, a demodulator section 802, and control logic 826. Differential integrator circuit 804 can include a differential amplifier 862, a first integrating capacitance Cint0, and a second integrating capacitance Cint1. Differential inputs (+, −) of differential amplifier can be connected to demodulator section 802 to receive a capacitance sense input signal (Im).

Remainder retention section 86 can include a comparator 806 (implemented by op amp OA1), an output switch 824, a IDAC 814, and a switch network (G0, G1, SW3 and SW4).

A switch network (G0/1, SW3/4) can connect reference currents (+Iref/−Iref) to integrating capacitances (Cint0/Cint1) according to excitation signal Tx and Gate signal (which can be generated from an output of comparator 806, Cout). Thus, on one half cycle of Tx, +Iref can be applied to Cint0, while Cint1 is used to integrate an input signal Im. On the next half cycle, −Iref can be applied to Cint1, while Cint0 is used to integrate an input signal Im. Within each half cycle, reference currents (+Iref/−Iref) can be terminated in response to the Gate signal (i.e., comparator 806).

Comparator 806 can have inputs connected to differential outputs of differential amplifier 862. An output signal (Cout) from comparator 806 can be synchronized with a clock signal Clk (i.e., quantized). Output switch 824 can isolate an output of the comparator 806 while switches of switch network (S3/S4) and demodulator section (S1/S2) operate.

Demodulator section 802 can include switches S1 and S2. Switch S1 can connect a capacitance sense input signal (Im) to the (−) input of differential amplifier 862 when signal Tx is low, and switch S2 can connect signal (Im) to the (+) input of differential amplifier 862 when signal Tx is high. That is, demodulator section 802 section connects input signal Im to the integrator circuit 804 in synchronism with the transmit signal Tx.

Control logic 826 can generate: an excitation signal (Tx) to generate input signal (Im); a Gate signal (from Cout); a BL signal which controls output switch 824; and a count value Ncx corresponding to a duration of pulse Cout, which can represent a sensed capacitance.

An embodiment like that of FIG. 8A can reduce if not eliminate the drawbacks noted for the embodiments of FIGS. 6A to 7B.

Use of a differential integrator 804 can allow demodulation by switching the input signal to the differential integrator 804 by operation of excitation signal Tx (which can be used to generate input signal Im). Switches S1 and S2 of demodulator section 802 can perform this function.

IDAC 814 can be used to generate a balancing current. However, unlike previously embodiments, IDAC 814 can include two outputs with currents of opposite direction (+Iref, −Iref). These currents can be used to balance an integrated input signal (Im) by connecting them to the integrator inputs with switches S3 and S4. Logic (G0/G1) can control these switches in response to the comparator output Gate (from Cout) and the Tx signal.

FIG. 8B is a timing diagram showing conversion operations for an embodiment like that of FIG. 8A. FIG. 8B shows: an input signal Im; a differential integrator voltage Uint (with respect to reference voltage Uref); a transmit signal Tx; operations of switches S1 to S4 (where high corresponds to closed, low to open); the Gate signal (Cout); and signal BL (which controls output switch 824).

Referring to FIG. 8B, conversions can begin with each edge (transition) of the Tx signal. A balancing current can be applied to the differential integrator 804 simultaneously with the Tx edge. Which current is used for balancing (i.e., +Iref, −Iref) can be defined according to the Tx signal. A measured current (Im) and balancing currents (i.e., +Iref or −Iref) can always be connected to the opposite inputs of the differential integrator 804. When the comparator output (i.e., Gate) indicates balance of charge, the balancing current flow is stopped by opening switch S3 or S4. An output of comparator 806 can be blocked with signal BL around the time when signal Tx signal transitions, to help prevent false triggering of the comparator. As compared to the embodiments of FIGS. 6A and 7A, control logic 826 can be much simpler than those embodiments, having no strict timing requirements for the various switches.

Embodiments described above can have like charge balancing (i.e., discharge) procedures. Balancing can be performed at the same time as the integration of the capacitance sense input signal. Such embodiments can rely on having a general understanding of the input signal form. In particular, it is known that the integrator output signal will be close to zero at the end of the integration operation. This can be particularly true in charge-transfer sensor arrays, where a measured capacitance (Cm) can be completely recharged.

As noted above, in actual operations, noise can accompany the measured signal. Thus, a comparator can detect a charge balance based on an integrator interacting with external noise sources. Operations in the presence of such noise are shown in FIG. 5B.

It is note that the impact of noise on a conversion result can depend on a ratio of the balancing (discharge) slope rate to a noise rate of change. When noise changes faster than the discharging slope rate, it is observed that a noise rectification effect can change the noise distribution on the convertor output. This effect can lead to significant degradation of the convertor performance with increasing the noise levels.

One way to address such noise issues can be to detect a charge balance condition when an integrator is disconnected from an input. In such an embodiment, charge balancing (discharge) can occur after signal integration. However, such an action can require more time, as compared to approaches that integrate and discharge at the same time. One such embodiment is shown in FIGS. 9A and 9B.

Figure 9A:
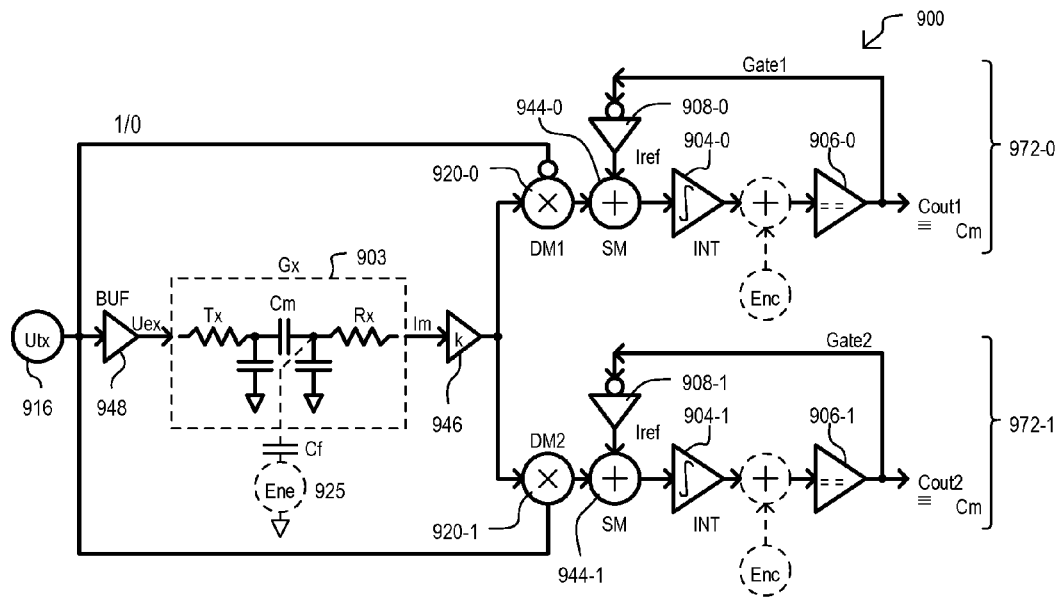
FIG. 9A is a block diagram of a system according to an embodiment.

FIG. 9A is a functional schematic of a system 900 according to another embodiment. A system 900 can include two independent charge balancing channels. Such channels can operate like those of embodiments described above, however, each channel is dedicated to conversions corresponding to a particular transition of an excitation signal, allowing integrating and conversion operations to occur over a full cycle of an excitation signal, rather than a half cycle. Further, as an integrated/discharged voltage is near a reference level, an input signal can be disconnected form the integrator, to prevent input signal noise from affecting a comparison between the integrated voltage and the reference level.

A system 900 can include items like those of FIG. 4, and such like items are referred to by the same reference character but with the leading digit being "9" instead of "4". As shown, system 900 differs from that of FIG. 4 in that it can include two channels 972-0/1. One channel (i.e., 972-0) can receive a capacitance input signal from its demodulator 944-0 on falling edges of Tx, and not rising edges of Tx. Thus, it can integrate its signal and then discharge the signal over a time period longer than a half cycle of Tx. Similarly, the other channel (i.e., 972-1) can receive a capacitance input signal from its demodulator 944-1 on rising edges of Tx, and not falling edges of Tx. Thus, it can also integrate its signal and then discharge the signal over a time period longer than a half cycle of Tx.

Figure 9B:
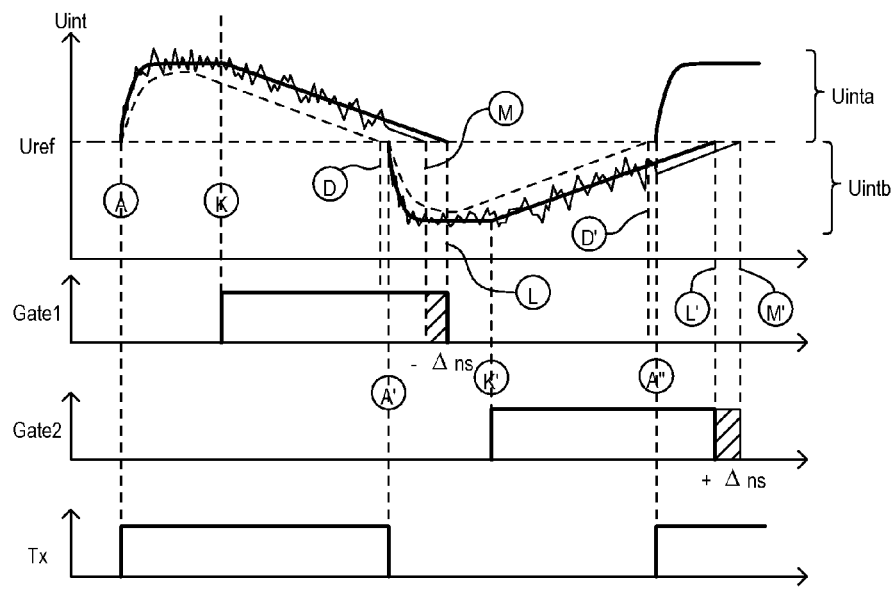
FIG. 9B is a timing diagram showing the operation of a system like that of FIG. 9A.

FIG. 9B is a timing diagram showing conversion operations for an embodiment like that of FIG. 9A. FIG. 9B shows: integrator voltages Uinta, Uintb for different channels; a signal Gate1 which can terminate the reference current of one channel; a signal Gate2 which can terminate the reference current of another channel; and a transmit signal Tx.

Referring to FIG. 9B, integration/discharge operations can start for one channel (i.e., Uinta) on a rising edge of Tx (point A). Integration/discharge operations can start for the other channel (i.e., Uintb) on a falling edge of Tx (point A').

The dashed waveform shows a response like that for embodiments described above, which can include integration and discharge at the same time. Such simultaneous integration/discharge can result in a conversion that ends at point D.

In contrast, in an embodiment like that of FIG. 9A, discharge can be delayed with respect to integration. The solid waveform shows a response for an embodiment like that of FIG. 9A. In the particular example shown, the start of a discharge operation is delayed to point K for Uinta (and point K' for Uintb). Further, the discharge operation ends at point M (point M' for Uintb), after the falling edge of Tx (i.e., after point A').

It is noted that for that portion of the discharge operation extending into the next half cycle, the integrated value will not suffer from input signal related noise. Thus, integrated value Uinta between A' and M is shown as noise free, and integrated value Uintb between A" and L' is shown as noise free.

Figure 10:
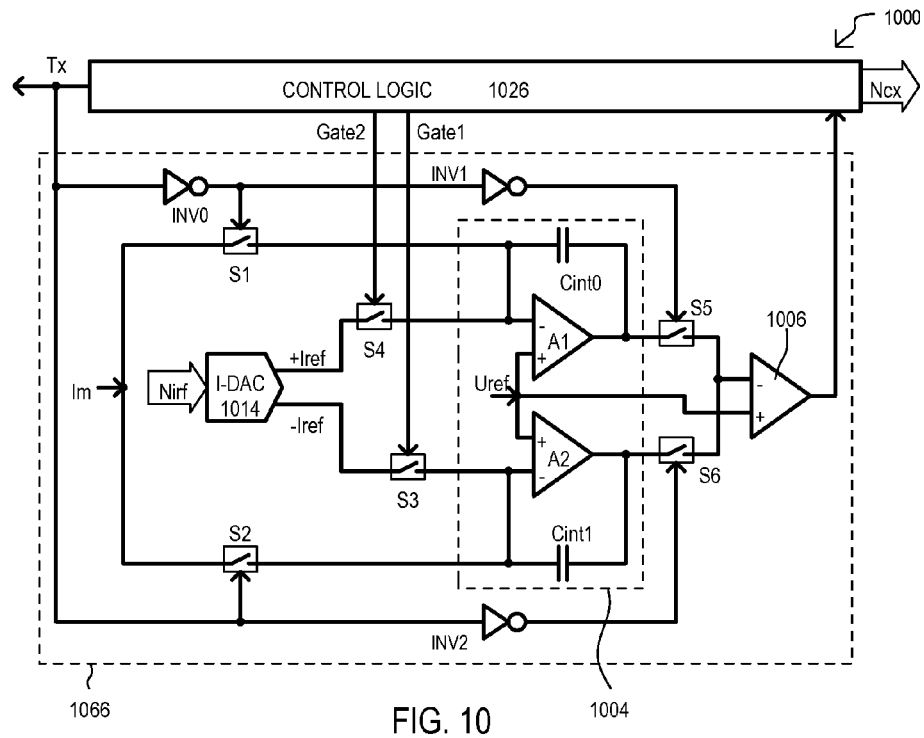
FIG. 10 is a block diagram of a system according to an embodiment.

FIG. 10 is a block schematic diagram of a system 1000 according to another embodiment. A system 1000 can operate like that shown in FIGS. 9A and 9B. A system 1000 can include a differential integrator/discharge (referred to hereinafter as a "differential integrator") circuit 1004, a remainder retention section 1066, and control logic 1026. Differential integrator circuit 1004 can include amplifiers (A1, A2), first integrating capacitance Cint0, and second integrating capacitance Cint1, which together can form a pseudo-differential integrator. Non-inverting inputs (+) can be connected to receive a reference voltage Uref. In addition, inverting input (−) of A1 can receive capacitance sense input signal (via switch S1) and a reference current (+Iref) (via switch S4), while inverting input (−) of A2 can receive capacitance sense input signal (via switch S2) and a reference current (−Iref) (via switch S3).

Remainder retention section 1066 can include a comparator 1006, IDAC 1014, and a switch network (INV0 to INV2 and S1 to S6). A switch network (INV0 to INV2 and S1 to S6) can connect input signal Im to differential integrator circuit 1004 according to excitation signal Tx. Reference currents (+Iref/−Iref) can be applied to differential integrator circuit 1004 according to gate signals (Gate2 and Gate1).

Thus, on a falling edge of Tx, input signal Im can be applied and integrated by A1/Cint0 (via S1). The output of A1 can be isolated from the comparator 1006 (via S5). At a later time, reference current +Iref can be applied to discharge Cint0 (via S4). On the next rising edge of Tx, input signal Im can be isolated from A1/Cint0 (via S1). However, discharge can continue (or even start) with less noise (i.e., without Im being integrated). The output of A1 can be applied to the comparator 1006 (via S5).

Conversely, on a rising edge of Tx, input signal Im can be applied and integrated by A2/Cint1 (via S2). The output of A2 can be isolated from the comparator 1006 (via S6). At a later time, reference current −Iref can be applied to discharge (charge) Cint1 (via S3). On the next falling edge of Tx, input signal Im can be isolated from A2/Cint1 (via S2). However, discharge (charge) can continue (or even start) with less noise. The output of A2 can be applied to the comparator 1006 (via S6).

Figure 11:
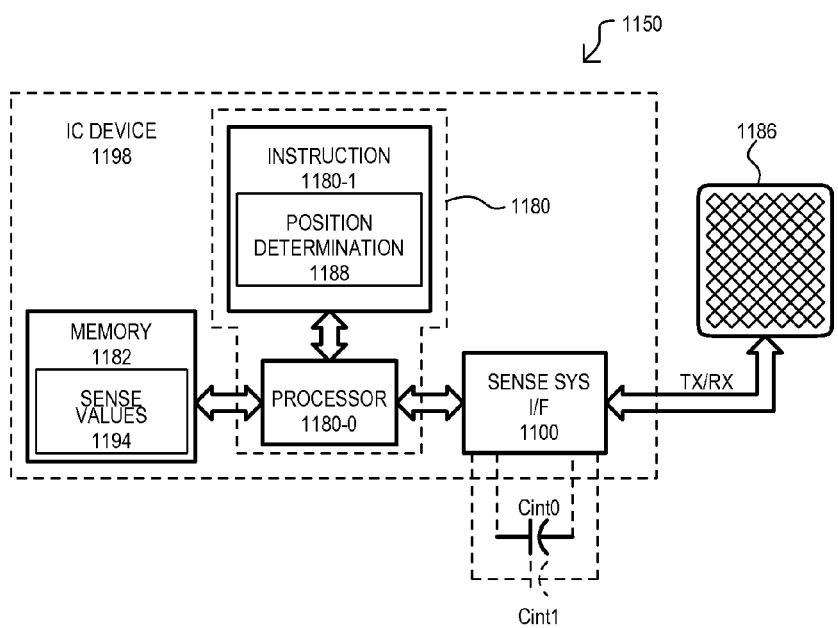
FIG. 11 is a block diagram of an integrated circuit device according to an embodiment.

FIG. 11 shows a system 1150 according to another embodiment. A system 1150 can include a sense section 1100, a processing section 1180, a memory section 1182, and a capacitance sense network 1186.

A capacitance sense network 1186 can include a number of capacitance sensors that can provide values reflecting the proximity of one or more objects. In the embodiment shown, a capacitance sense network 1186 can be a touch mutual capacitance sensing network that includes transmit (TX) and receive (RX) electrodes, and can generate capacitance values that vary according to the proximity of fingers. In one embodiment, TX and RX electrodes can be perpendicular to one another, with TX electrodes being driven to induce a change on RX electrodes. Such changes can be sensed to detect variations in capacitance, and hence the proximity of an object. A position of the object can be determined based on the TX electrode driven, and the RX electrode exhibiting the change in capacitance.

A sense section 1100 can drive TX electrodes of network 1186 and sense values on RX electrodes. A sense section 1100 can include any of the sense systems shown in the embodiments above, or equivalents. Thus a sense section 1100 can provide values (e.g., counts) that can identify the proximity of an object. Such values can correspond to position information (i.e., TX/RX electrode numbers).

A processing section 1180 can include a processor 1180-0 that can execute functions stored instructions 1180-1. Instructions can enable a processing section to execute various functions, including position determination functions 1188 to determine the position of one or more objects in relation to capacitance sense network 1186.

A memory section 1182 can store various data values for a processing section 1180-0. In the embodiment shown, a memory section 1182 can store sense values 1194 generated by section 1100.

While memory section 1182 and instructions 1180-1 may exist in different memories (e.g., one in a volatile memory the other as firmware in a nonvolatile memory), in alternate embodiments such data can occupy different locations in a same memory.

In the particular embodiment shown, a processing section 1180, a memory section 1182, and a sense section 1184 can be parts of a same integrated circuit (IC) device 1198. For example, such sections can be formed in a same IC substrate, or may be formed in a same package (e.g., multi-chip package). In one very particular embodiment, an IC device can be from the PSoC®, CapSense® and/or TrueTouch® family of devices manufactured by Cypress Semiconductor Corporation of San Jose, Calif., U.S.A.

The embodiments above have shown systems, circuits, devices and corresponding methods. An additional method embodiment will now be described with reference to flow diagrams.

Figure 12:
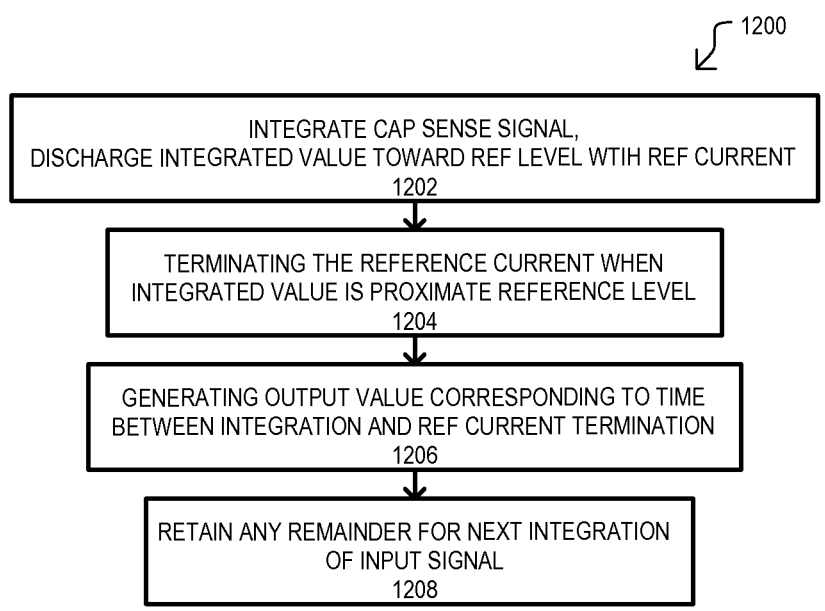
FIG. 12 is a flow diagram of a method according to an embodiment.
Figure 13:
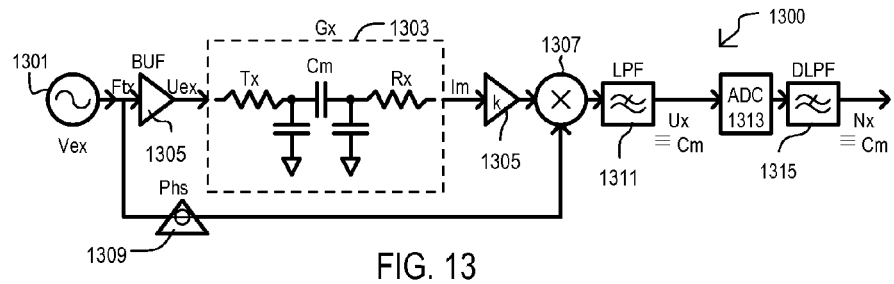
FIG. 13 is a functional schematic diagram of a conventional capacitance sense system.
Figure 14A:
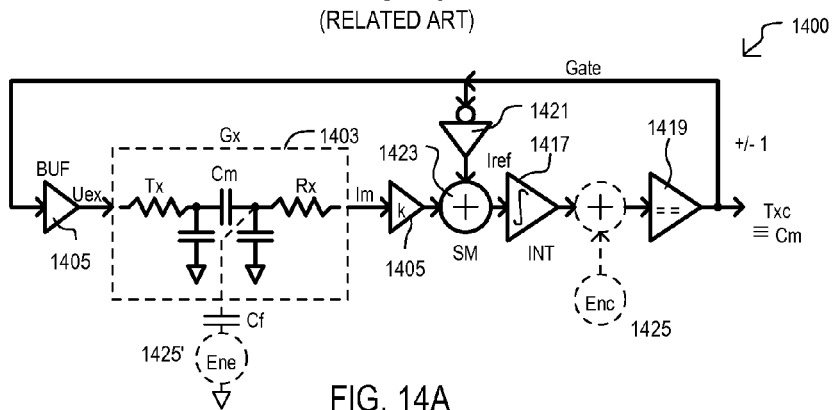
FIG. 14A is a functional schematic diagram of another conventional capacitance sense system.
Figure 14B:
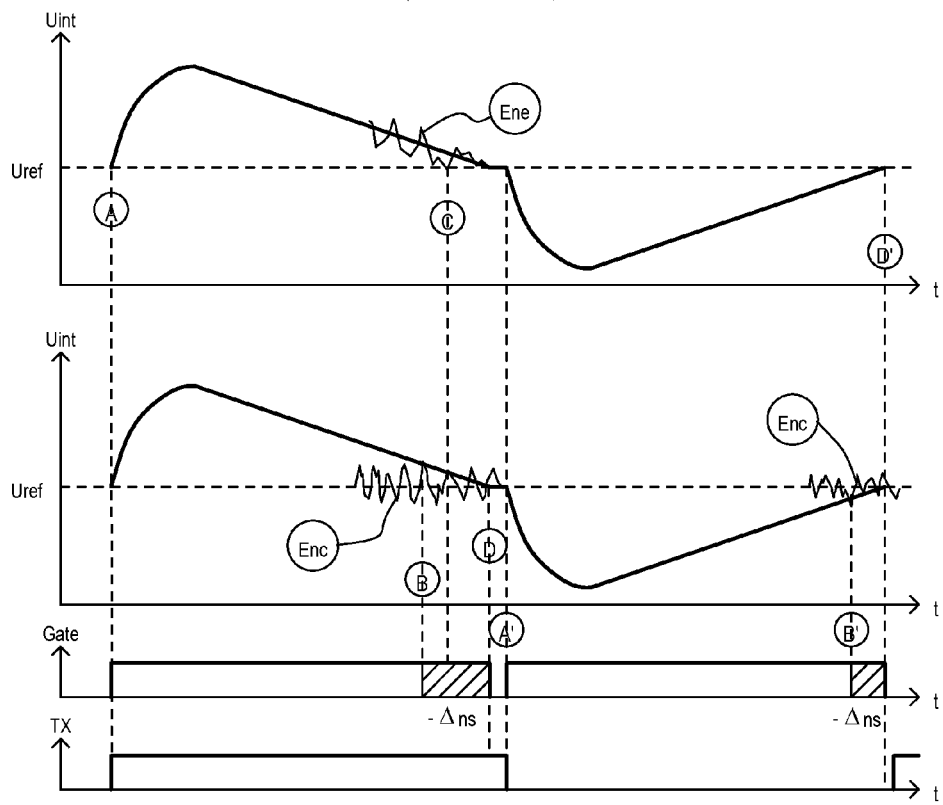
FIGS. 14B and 14C are timing diagrams showing a noise responses for a system like that of FIG. 14A.
Figure 14C:
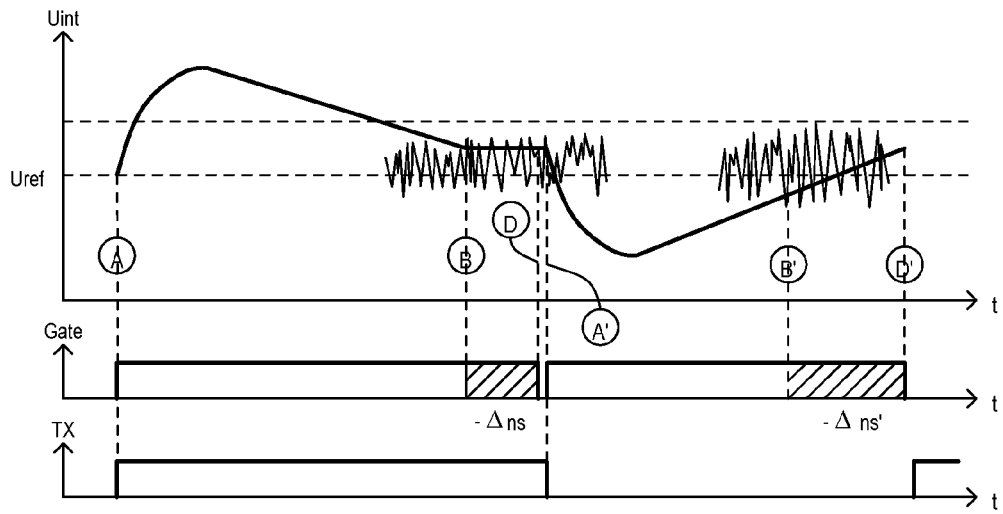

FIG. 12 is a flow diagram of a method 1200 according to an embodiment. A method 1200 can include integrating a capacitance sense signal and discharging the integrated value toward a reference level with a reference current (1202). Such an action can include a simultaneous integration and discharge or an integration followed by a discharge. A method 1200 can also include terminating the reference current when the integrated value is proximate the reference level (1204). Such an action can include comparing the integrated value to the reference value, and generating a termination signal when the integrated value is determined to be at the reference level. In some embodiments, such a termination signal can be quantized, being activated according to a periodic clock signal.

A method 1200 can also include generating an output value corresponding to the time between the integration and reference current termination (1206). Such an action can include counting the number of clock cycles in such a time period.

A method 1200 can include retaining any remainder from a conversion for the next integration of the input signal (1208). Such an action can include retaining a quantization error, or error resulting from noise. According to embodiments, remainders arising in a first integration/discharge operation can result in remainders in a subsequent integration/discharge operation that tend to be the opposite of the first such operation. Remainders can include "quantization errors" or errors arising from noise, as described for the embodiments herein, or equivalents.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A capacitance sense system, comprising:
a capacitance sense input configured to receive an input signal that varies according to a sensed capacitance;
an integrator/discharge circuit configured to integrate the input signal and discharge the integrated input signal toward the reference level in conversion operations; and
a remainder retainer section configured to quantize the discharging of the integrated input signal, and retain any remainder of the integrated input signal that follows a quantization point for a next conversion by the integrator/discharge circuit.

2. The capacitance sense system of claim 1, wherein:
the remainder retainer section includes
a comparator having a first input coupled to the integrator/discharge circuit, and configured to generate a comparator output signal that transitions in synchronism with a periodic signal, and
a current supply circuit configured to supply at least one reference current to the integrator circuit, and to disable the reference current in response to the comparator output signal.

3. The capacitance sense system of claim 1, wherein:
the integrator/discharge circuit comprises
a first operational amplifier (op amp) having a first op amp input coupled to receive the input signal and a reference current from the remainder retainer section, and a second op amp input coupled to receive a reference voltage, and
first capacitor connections disposed between the first op amp input and an op amp output, and configured to accept a first integrating capacitance.

4. The capacitance sense system of claim 1, wherein:
the integrator/discharge circuit comprises
a differential integrator having a first differential input coupled receive the input signal and a first reference current from the remainder retainer section, and a second differential input coupled to receive the input signal and a second reference current from the remainder retainer section;
first capacitor connections disposed between the first differential input and an integrator output, and configured to accept a first integrating capacitance, and
second capacitor connections disposed between the second differential input and integrator output, and configured to accept a second integrating capacitance.

5. The capacitance sense system of claim 1, further including:
a demodulator section configured to demodulate an initial input signal with a time varying transmit signal to generate the input signal.

6. The capacitance sense system of claim 5, wherein:
the demodulator section includes at least one switch coupled between a sense input and the integrator/discharge circuit that is enabled in response to a control signal that is synchronous with the transmit signal.

7. The capacitance sense system of claim 5, wherein:
the integrator/discharge circuit includes first and second capacitor connections configured to connect to terminals of a capacitor; and
the demodulator section includes a switch network configured to connect the first capacitor connection to receive a reference current in response to a first timing signal having a first value, and connect the second capacitor connection to the receive the reference current in response to a first timing signal having a second value; wherein
the first timing signal is synchronous with the transmit signal.

8. The capacitance sense system of claim 5, wherein:
the integrator/discharge circuit includes first and second differential inputs; and
the demodulator section includes a switch network configured to connect a first reference current to flow into the first differential input in response to a first timing signal having a first value, and connect a second reference current to flow from the second differential input in response to the first timing signal having a second value; wherein
the first timing signal is synchronous with the transmit signal.

9. A method, comprising:
integrating a capacitance sense input signal and discharging the integrated input signal toward a reference level with a reference current;
terminating the reference current when the integrated and discharged input signal is proximate the reference level;
generating an output value representing the time between the start of the integrating of the input signal and the terminating of the reference current; and
retaining any remainder arising from the terminating of the reference current for use for in a next integrating and discharging of the input signal; wherein
the remainder comprises a difference between the integrated and discharged input signal and the reference level.

10. The method of claim 9, wherein:
discharging the integrated value includes generating a discharge current with a current source controlled by a comparison between the integrated and discharged input signal and the reference level.

11. The method of claim 9, wherein:
terminating the reference current includes terminating the reference current according to a comparison between the integrated and discharged input signal and the reference level.

12. The method of claim 9, further including:
generating the capacitance sense input signal by
driving at least one of a plurality of transmit electrodes of a sensor array with a time varying transmit signal, and
receiving a corresponding capacitance sense current on at least one of a plurality of receive electrodes of the sensor array; wherein
the transmit electrodes are disposed in a first direction and the receive electrodes are disposed in a second direction different from the first direction.

13. The method of claim 12, wherein:
generating the capacitance sense input signal further includes demodulating the capacitance sense input signal with the transmit signal.

14. The method of claim 9, further including:
the reference current is terminated synchronous to a reference clock signal, and the remainder includes any quantization error from such a termination; and
generating a count value from the output value by counting the duration of the output value according to a periodic signal that is the same as, or synchronous to, the reference clock signal.

15. The method of claim 9, further including:
integrating the capacitance sense input signal includes
  charging a first capacitance with the input signal in a first conversion, and
  charging a second capacitance with the input signal in a second conversion following the first conversion; and
discharging the integrated input signal includes
  applying a reference current that flows into the second capacitance in the first conversion, and
  applying a reference current that flows from the first capacitance in the second conversion.

16. A method, comprising:
for each of a plurality of conversion operations
integrating a capacitance sense input signal and discharging the integrated input signal toward a reference level, and terminating the discharging of the integrated input signal in response to the integrated input signal being determined to be proximate a reference level;
generating an output value corresponding to the time between the start of the integrating of the input signal and the termination of the discharging of the integrated input signal; and
retaining any remainder in the conversion operation for inclusion in a subsequent conversion operation.

17. The method of claim 16, further including:
generating the capacitance sense input signal by
  inducing a current on one of a plurality of receive electrodes coupled to at least one transmit electrode that receives a time varying transmit signal.

18. The method of claim 16, wherein:
integrating the input signal includes integrating the signal with an integrator operational amplifier (op amp) having an integrating capacitor in a feedback loop; and
discharging the integrated value includes applying a reference current to the integrating capacitor.

19. The method of claim 16, wherein:
integrating the input signal includes applying the input signal to first or second differential inputs of a differential integrator according to a control signal synchronous with transmit signal.

20. The method of claim 16, further including:
terminating the discharging of the integrated input signal in synchronism with a timing clock; and
generating a count value for each conversion according to a number of reference clock transitions during the output value; wherein
the reference clock is synchronous with the timing clock.

* * * * *